United States Patent
Ikegami et al.

(10) Patent No.: US 8,531,866 B2
(45) Date of Patent: Sep. 10, 2013

(54) NONVOLATILE MEMORIES AND RECONFIGURABLE CIRCUITS

(75) Inventors: Kazutaka Ikegami, Tokyo (JP);
Atsuhiro Kinoshita, Kamakura (JP);
Daisuke Hagishima, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 151 days.

(21) Appl. No.: 13/213,871

(22) Filed: Aug. 19, 2011

(65) Prior Publication Data
US 2012/0026779 A1    Feb. 2, 2012

Related U.S. Application Data

(63) Continuation of application No. PCT/JP2010/052635, filed on Feb. 22, 2010.

(30) Foreign Application Priority Data

Mar. 19, 2009 (JP) .................................. 2009-68124

(51) Int. Cl.
*G11C 11/00* (2006.01)

(52) U.S. Cl.
USPC ............................ 365/148; 365/158; 365/175

(58) Field of Classification Search
USPC .................. 365/148, 154, 158, 163, 171, 173, 365/175
See application file for complete search history.

(56) References Cited

U.S. PATENT DOCUMENTS 6,944,050 B2    9/2005 Kang et al.
2004/0105301 A1*  6/2004 Toyoda et al. ................. 365/154

(Continued)

FOREIGN PATENT DOCUMENTS

JP    2004-140091 A    5/2004
JP    2004-213860 A    7/2004

(Continued)

OTHER PUBLICATIONS

V. Betz, et al. "Architecture and CAD for Deep-Submicron FPGAs—Chapter 2: Background and Previous Work," Kluwer Academic Publishers, pp. 11-13, Feb. 1999.

(Continued)

*Primary Examiner* — Alexander Sofocleous
*Assistant Examiner* — Hien Nguyen
(74) *Attorney, Agent, or Firm* — Oblon, Spivak, McClelland, Maier & Neustadt, L.L.P.

(57) ABSTRACT

A nonvolatile memory according to an embodiment includes at least one memory cell including: a variable resistance memory comprising one end connected to a first terminal, and the other end connected to a second terminal, a drive voltage being applied to the first terminal; and a diode comprising a cathode connected to the second terminal, and an anode connected to a third terminal, a ground potential being applied to the third terminal. An output of the memory cell is output from the second terminal, the output of the memory cell depends on a resistance state of the variable resistance memory.

14 Claims, 30 Drawing Sheets

(56) References Cited

U.S. PATENT DOCUMENTS

| | | | |
|---|---|---|---|
| 2005/0045919 A1 | 3/2005 | Kaeriyama et al. | |
| 2005/0117397 A1* | 6/2005 | Morimoto | 365/185.21 |
| 2005/0167699 A1* | 8/2005 | Sugita et al. | 257/202 |
| 2007/0146012 A1 | 6/2007 | Murphy et al. | |
| 2007/0217254 A1 | 9/2007 | Matsuoka et al. | |
| 2008/0175031 A1* | 7/2008 | Park et al. | 365/51 |

FOREIGN PATENT DOCUMENTS

| | | |
|---|---|---|
| JP | 2005-101535 A | 4/2005 |
| JP | 2006-127612 A | 5/2006 |
| JP | 2006-351779 A | 12/2006 |
| JP | 2007-207406 A | 8/2007 |
| JP | 2008-538657 A | 10/2008 |
| WO | WO 2005/098952 A1 | 10/2005 |
| WO | WO 2006/113815 A1 | 10/2006 |

OTHER PUBLICATIONS

International Search Report issued May 11, 2010 in PCT/JP2010/052635 filed Feb. 22, 2010 (in English language).

Japanese Office Action issued Jan. 8, 2013 in Patent Application No. 2009-068124 with English Translation.

English translation of the International Preliminary Report on Patentability and Written Opinion issued Oct. 27, 2011 in patent application No. PCT/JP2010/052635 filed Feb. 22, 2010.

Office Action issued Oct. 19, 2012 in Japanese Patent Application No. 2009-068124 (with English-language translation).

* cited by examiner

NONVOLATILE MEMORIES AND RECONFIGURABLE CIRCUITS

CROSS-REFERENCE TO RELATED APPLICATION

This application is based upon and claims the benefit of priority from prior Japanese Patent Application No. 2009-68124 filed on Mar. 19, 2009 in Japan and PCT/JP 2010/052635 filed on Feb. 22, 2010, the entire contents of which are incorporated herein by reference.

FIELD

Embodiments described herein relate generally to nonvolatile memories and reconfigurable circuits.

BACKGROUND

The LSI industry has grown with the technique of scaling. Where the sizes of transistors are scaled (reduced), the performance of the transistors can be improved, and the number of transistors per area can be increased. By taking advantage of such improvement in performance, the LSI industry has developed while creating new markets. In recent years, however, it is difficult to make profits in many product categories with the advanced technique of scaling, due to increased costs and shortened lives of products.

Under such circumstances, attention is being drawn to FPGAs (Field Programmable Gate Arrays) (see V. Betz, J. Rose and A. Marquardt, "Architecture and CAD for Deep-Submicron FPGAs" (Kluwer Academic Publishers), February 1999, for example). FPGAs are reconfigurable logic circuits. Therefore, FPGAs have advantages such as shortened development periods, easier circuit corrections, and the elimination of initial development investment. Being programmable, FPGAs require higher costs for their performance, compared with ASICs (Application Specific Integrated Circuits). However, the performance of FPGAs improves with scaling. Therefore, FPGAs are expected to replace ASICs in various fields in the future.

In a conventional FPGA, circuit information is configured in SRAMs, to achieve programmability. In FPGAs, the circuits that perform logic operations and wire circuits need to be reconfigurable. Therefore, SRAMs occupy large portion of the chip area of each FPGA. Also, since SRAMs are volatile memories, the circuit information disappears once the power is turned off.

DETAILED DESCRIPTION

A nonvolatile memory according to an embodiment includes at least one memory cell including: a variable resistance memory comprising one end connected to a first terminal, and the other end connected to a second terminal, a drive voltage being applied to the first terminal; and a diode comprising a cathode connected to the second terminal, and an anode connected to a third terminal, a ground potential being applied to the third terminal. An output of the memory cell is output from the second terminal, the output of the memory cell depends on a resistance state of the variable resistance memory.

Before embodiments of the present invention are described, the structure of a FPGA is roughly explained first.

Figure 1:
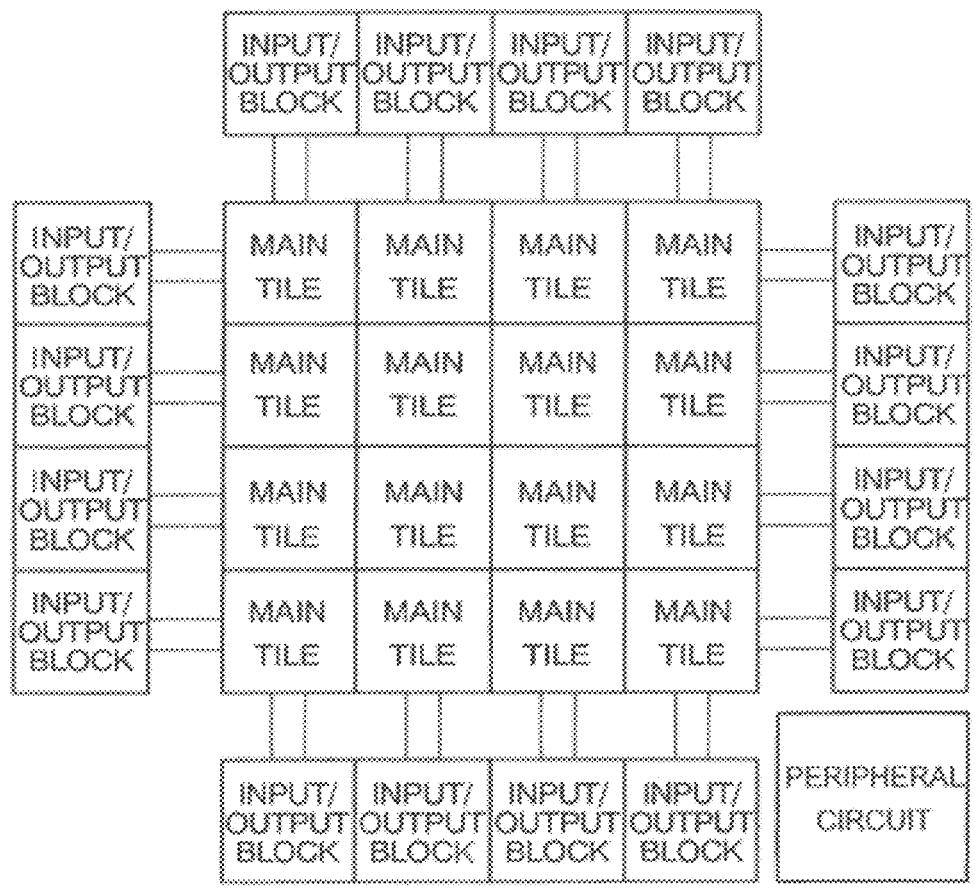
FIG. 1 is a block diagram showing a specific example of a FPGA.

FIG. 1 is a block diagram showing a specific example of a FPGA. This FPGA includes main tiles, input/output blocks, and peripheral circuits. The main tiles are circuit blocks that perform logical operations. The input/output blocks are blocks that exchange information with the inside and the outside of the chip. The peripheral circuits include a circuit for supplying power to the chip, a circuit for writing circuit information into a SRAM, a clock generator circuit, and the like.

Figure 2:
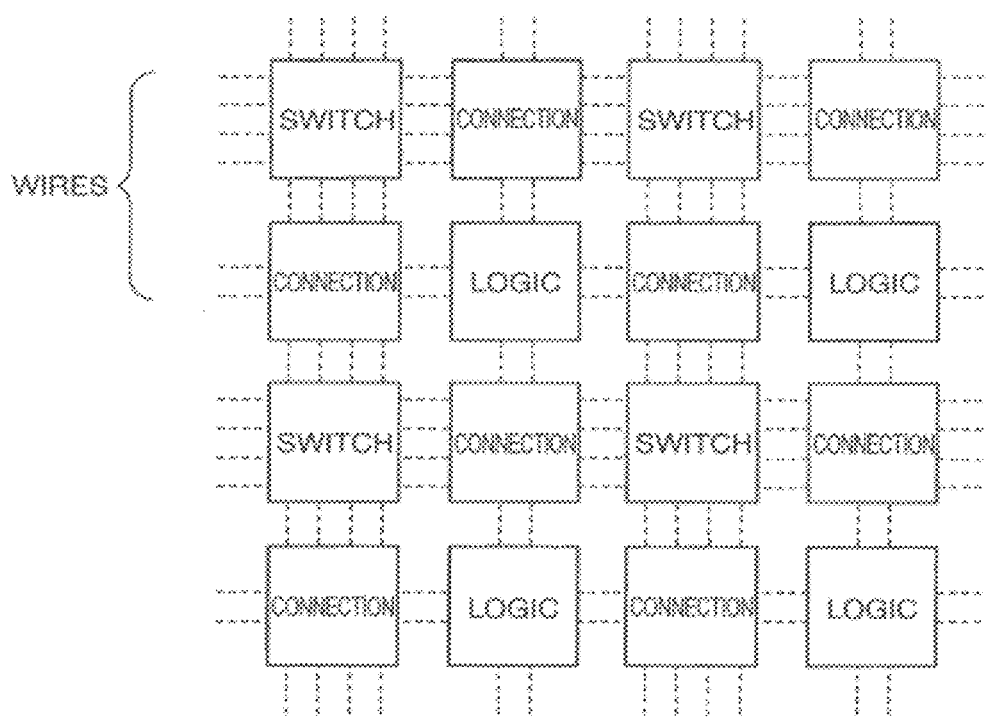
FIG. 2 is a block diagram showing a specific example of a main tile.

FIG. 2 is a block diagram showing a specific example of a main tile. A main tile includes logic blocks, connection blocks, and switch blocks. The respective blocks are connected via wirings. The logic blocks are blocks that perform logical operations.

The connection blocks are blocks that connect the logic blocks and the wirings. The switch blocks are blocks that control connections and disconnections between the respective orthogonally intersecting wirings. In the following, the respective blocks are described in greater detail.

Figure 3:
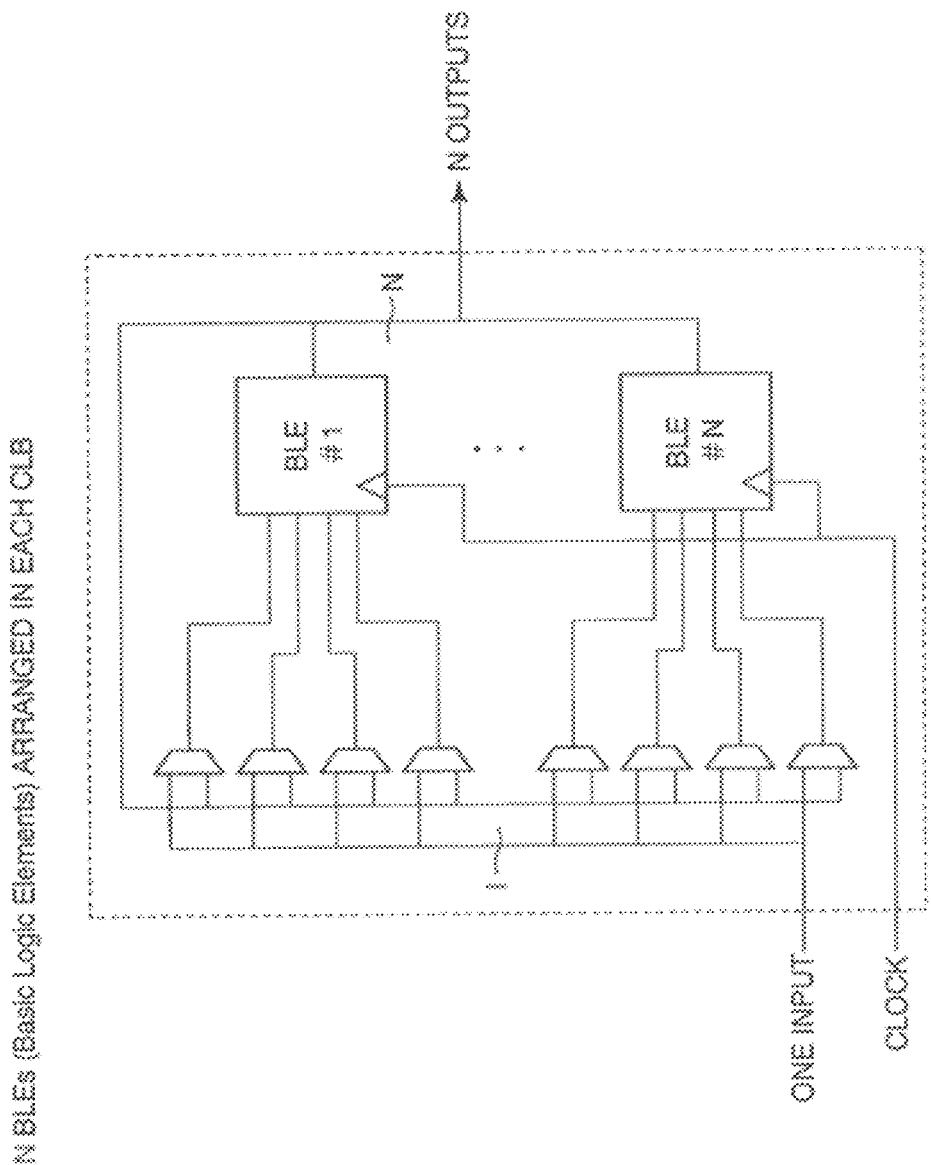
FIG. 3 is a circuit diagram showing a specific example of a logic block.

FIG. 3 is a circuit diagram showing a specific example of a logic block. A logic block includes basic logic elements (BLE) and a multiplexer. The number of inputs is I, and the number of outputs is N. BLEs are the smallest elements that perform logical operations in a FPGA.

Input and output signals of the logic block are input to the multiplexer. The multiplexer selects one of the signals, and outputs the selected signal to the inputs of the BLE. Which one of the signals input to the multiplexer should be output is determined by the value stored in the SRAM connected to the select signal of the multiplexer.

Figure 4:
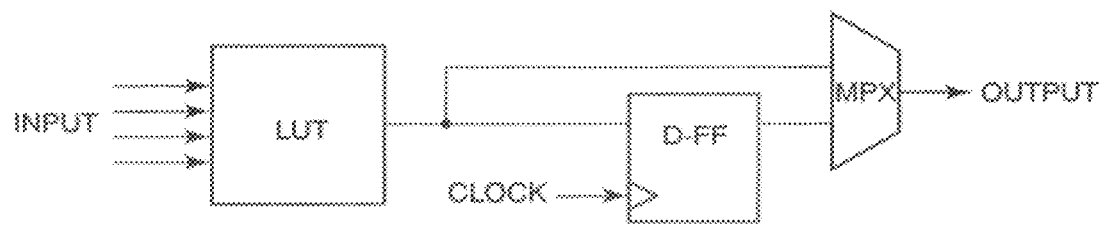
FIG. 4 is a circuit diagram showing a specific example of a BLE.

FIG. 4 is a circuit diagram showing a specific example of a BLE. A BLE includes a look-up table (LUT), a flip-flop (D-FF), and a multiplexer (MPX).

Figure 5:
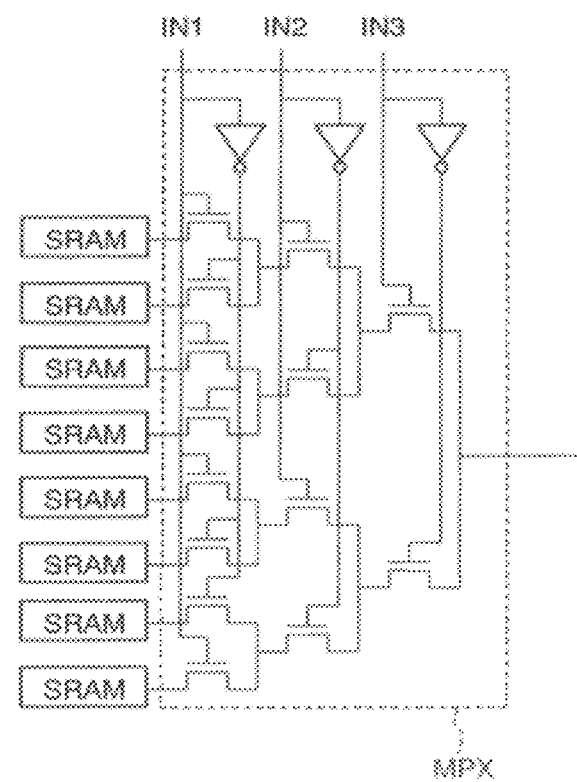
FIG. 5 is a circuit diagram showing a specific example of a look-up table.
Figure 6:
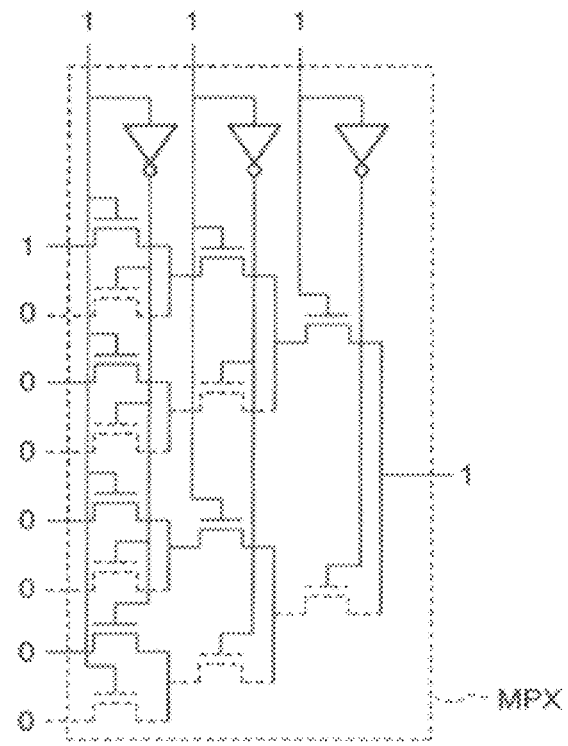
FIG. 6 is a diagram showing an operation of a three-input, one-output look-up table.

FIG. 5 shows a specific example of the look-up table circuit. The look-up table is a three-input, one-output circuit. Normally, the number of inputs and the number of outputs can be arbitrarily set, and are determined by taking into consideration the area, delay, and power consumption of the entire circuit. The look-up table includes a multiplexer (MPX) having pass transistors arranged in a tree-like fashion, and SRAMs connected to ends of the tree. As a value is given to an input of the multiplexer, an output of one of the SRAMs is output from the multiplexer. As an example, FIG. 6 illustrates an operation of the three-input, one-output look-up table. In this example, a three-input, one-output AND operation is performed. In this case, the values shown in the drawing are written into the SRAMs. Only when "1, 1, 1" are supplied to inputs, "1" is output from the multiplexer. Other than that, "0" is output.

This operation is a typical three-input, one-output AND operation. By writing appropriate values into the SRAMs, a desired logical operation can be realized.

Figure 7:
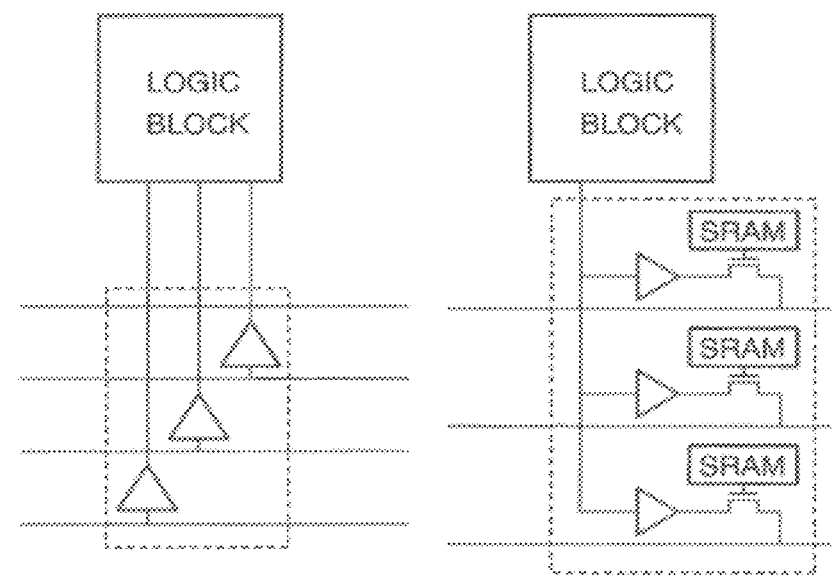
FIGS. 7(a) and 7(b) are circuit diagrams showing connection blocks.

Referring now to FIGS. 7(a) and 7(b), the connection blocks are described. A connection block includes a circuit that inputs signals from wires to a logic block, and a circuit that outputs an output signal from the logic block to the wires. The circuit surrounded by a broken line in FIG. 7(a) is a circuit that inputs signals from wires to a logic block. The circuit buffers the signals from wires, and inputs the signals to the logic block. In the drawing, all the signals from wires are input to the logic block, but not all the signals from the wires are necessarily input to the logic block. The circuit surrounded by a broken line in FIG. 7(b) is a circuit that outputs an output from the logic block to the wires. The circuit controls the ON/OFF state of a pass transistor in accordance with the value written into SRAMs. By switching the pass transistor between ON and OFF, the circuit controls to which interconnect the output from the logic block is connected. Although the output from the logic block is output to all the wires in FIG. 7(b), the output from the logic block is not necessarily output to all the wires.

Figure 8:
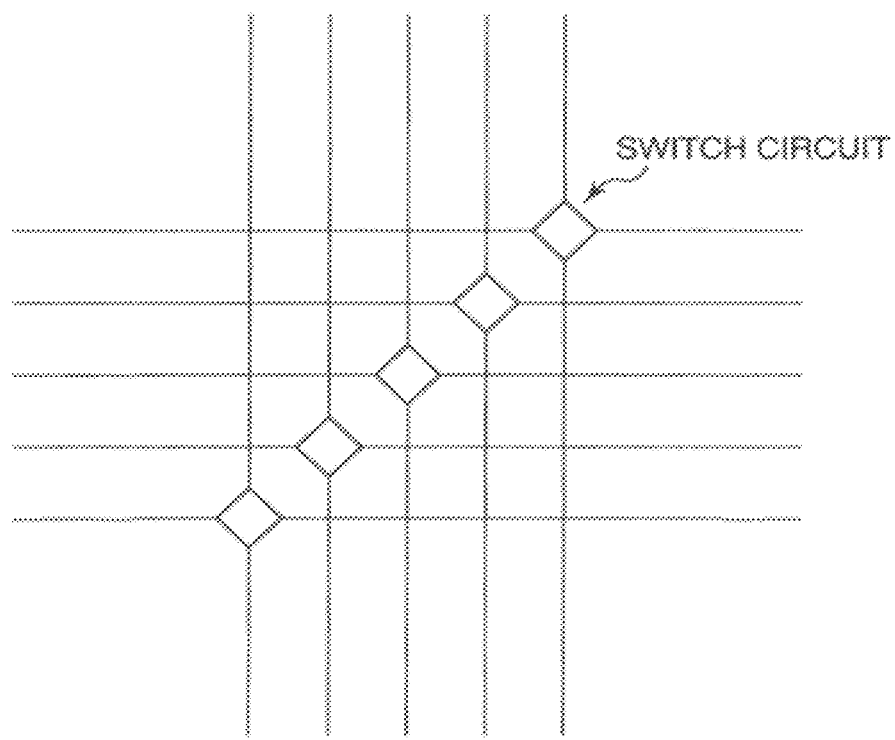
FIG. 8 is a circuit diagram showing a specific example of a switch block.
Figure 9:
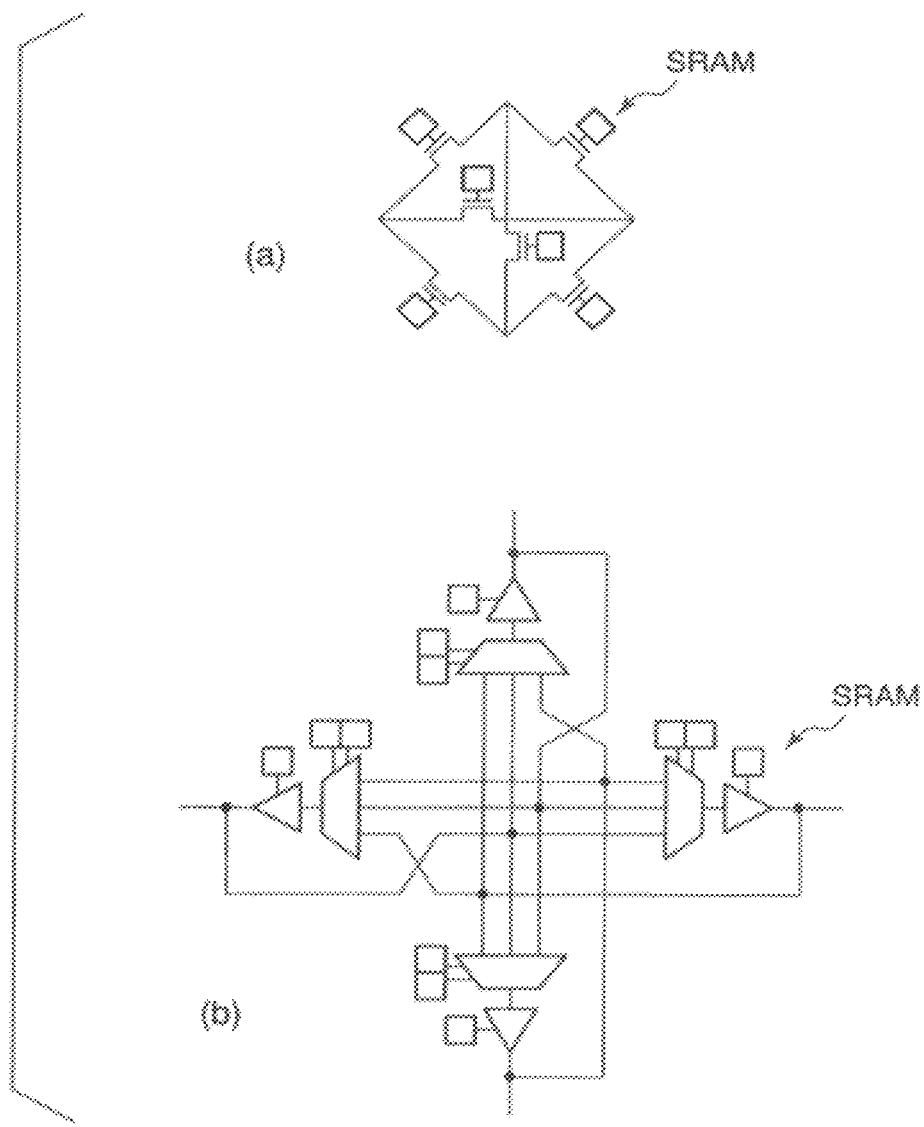
FIGS. 9(a) and 9(b) are circuit diagrams showing specific examples of switch circuits of the switch blocks.

FIG. 8 shows a specific example of a switch block. A switch block includes switch circuits that control connections between orthogonally intersecting wires. A switch circuit may be formed only by a pass transistor, or may include a buffer as well. FIG. 9(a) illustrates the former example, and FIG. 9(b) illustrates the latter example. Each switch circuit controls the connection between two wires in accordance with the value given to the SRAM connected to the pass transistor, a multiplexer, and a three-state buffer.

As can be seen from the above description, the proportion of SRAMs in a FPGA is very large. Also, since SRAMs are volatile, it is necessary to store circuit information in a different nonvolatile memory chip. Therefore, if the SRAMs can be replaced with a nonvolatile memory made of a novel material or the like, the probability that the area can be reduced should be high. Writing is performed on the SRAMs in a FPGA only in a circuit configuring process. Normally, in a circuit configuring process, the request for delays is not as strict as that in a circuit operation. Therefore, there is only a small problem with the use of memories such as variable resistance memories (hereinafter referred to as ReRAMs) that are lower in writing speed than SRAMs. Based on the above observations, the inventors developed novel nonvolatile memory cells using ReRAMs. Those nonvolatile memory cells are described below as embodiments.

The following is a description of the embodiments of the present invention, with reference to the accompanying drawings.

First Embodiment

Figure 10:
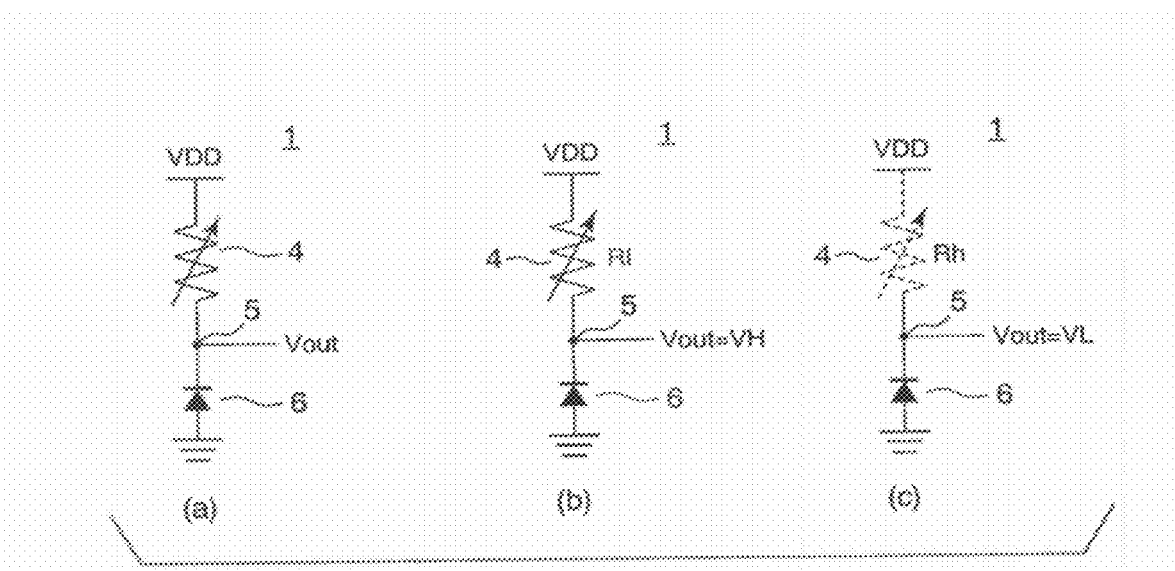
FIGS. 10(a), 10(b), and 10(c) are circuit diagrams showing a memory cell according to a first embodiment.

Referring to FIGS. 10(a), 10(b), and 10(c), a nonvolatile memory according to a first embodiment of the present invention is described. The nonvolatile memory of this embodiment includes at least one nonvolatile memory cell (hereinafter also referred to simply as the memory cell), and the structure of the memory cell is shown in FIG. 10(a). The memory cell 1 includes a variable resistance memory (ReRAM (Resistive Random Access Memory)) 4 and a diode 6 that are connected in series (FIG. 10(a)). One end of the ReRAM 4 is connected to a power supply VDD, and the other end is connected to the cathode of the diode 6. The anode of the diode 6 is grounded. The connection node between the ReRAM 4 and the diode 6 serves as an output terminal 5, and an output Vout of the memory cell 1 is output through the output terminal 5. Accordingly, the diode 6 is in a reverse-bias connected state, when seen from the output terminal 5.

When the ReRAM 4 is programmed to be in a low-resistance state RI, Vout=VH is output from the output terminal 5 (FIG. 10(b)). When the ReRAM 4 is programmed to be in a high-resistance state Rh, Vout=VL is output from the output terminal 5 (FIG. 10(c)). Where the reverse-bias resistance value of the diode 6 is Rd, the ReRAM 4 is designed so that Rh>>Rd>>RI is satisfied, or that Rd becomes much smaller than the resistance value Rh in a high-resistance state while the resistance value RI in a low-resistance state is much smaller than Rd. In this manner, VH can be made almost equal to VDD, and VL can be made almost equal to 0 V. As described above, the memory cell according to this embodiment can be programmed to have the output voltage Vout between VH and VL. Therefore, the SRAMs that store circuit information in a conventional FPGA can be replaced with memory cells according to this embodiment.

Figure 11:
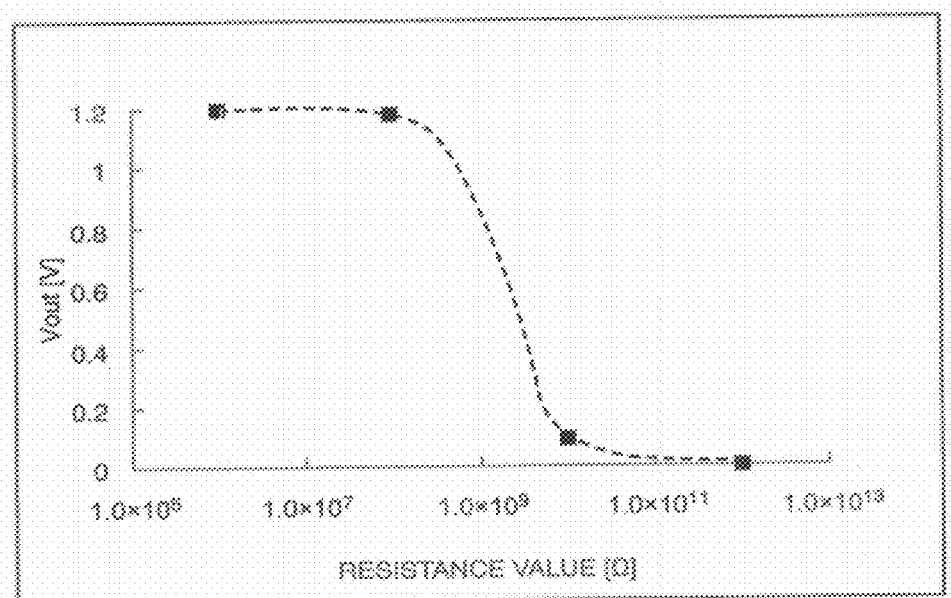
FIG. 11 is a graph showing the characteristics of a memory cell according to the first embodiment.

FIG. 11 shows the relationship between the resistance value of the ReRAM 4 and the output voltage Vout of the nonvolatile memory 1 in the memory cell 1 illustrated in FIGS. 10(a), 10(b), and 10(c). The source voltage VDD is 1.2 V. As can be seen from FIG. 11, in the memory cell 1 illustrated in FIGS. 10(a), 10(b), and 10(c), it is possible to realize that VH is almost equal to VDD, and VL is almost equal to 0 V. Also, as can be seen from FIG. 11, when VH is almost equal to VDD and VL is almost equal to 0 V, the ratio between Rh and RI (=Rh/RI) is preferably high. Specifically, the ratio between Rh and RI is preferably equal to or higher than $1.0 \times 10^4$.

Figure 12:
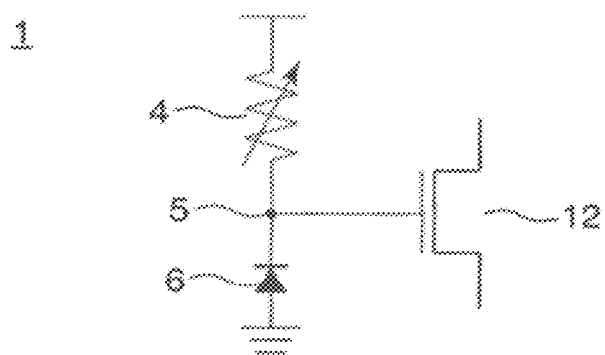
FIG. 12 is a circuit diagram showing a first specific example of a circuit element using a memory cell according to the first embodiment.

FIG. 12 shows a first specific example of a circuit element that uses the memory cell according to this embodiment. The circuit element of this specific example has a structure in which the gate of a pass transistor 12 is connected to the output terminal 5 of the memory cell 1 shown in FIG. 10(a). The circuit element of this specific example can be replaced with a circuit element in a conventional FPGA, such as a circuit or a three-state buffer circuit having a SRAM that stores circuit information and is connected to the gate of a pass transistor, for example.

Figure 13:
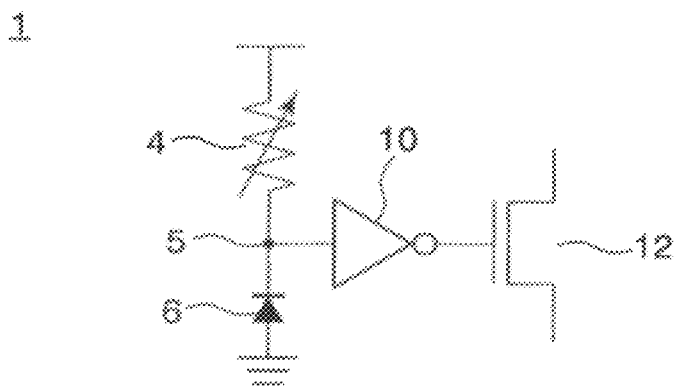
FIG. 13 is a circuit diagram showing the first specific example of the circuit element using a memory cell according to the first embodiment.

FIG. 13 shows a second specific example of a circuit element that uses the memory cell 1 according to this embodiment.

The circuit element of this specific example has a structure in which an inverter 10 is provided between the nonvolatile memory 1 shown in FIG. 10(a) and the pass transistor 12. Depending on the program voltage conditions of the ReRAM 4, the output of the memory cell 1 cannot be made sufficiently high, and the conductivity of the pass transistor 12 might become lower. In that case, with the inverter 10 being interposed in between, a sufficiently high voltage can be supplied to the gate of the pass transistor 12.

Next, a method of programming the nonvolatile memory cell 1 according to this embodiment is described. In general, ReRAMs can be classified into unipolar types and bipolar types, in terms of electrical characteristics.

Figure 14:
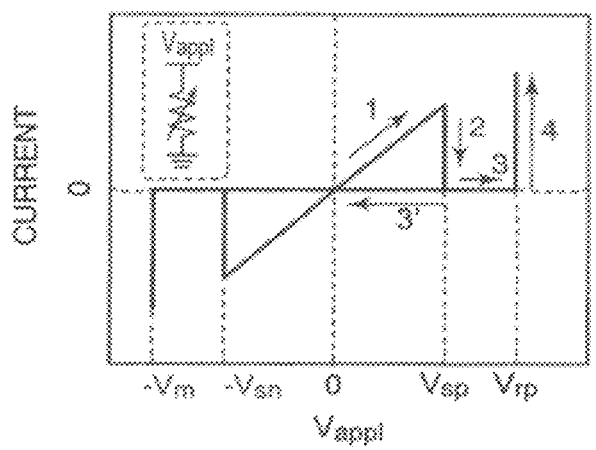
FIG. 14 is a diagram showing the characteristics of a unipolar-type ReRAM.

In a unipolar-type memory, the voltage polarity to vary the resistance state of ReRAMs is the same whether the resistance state is to be changed from a high-resistance state to a low-resistance state or is to be changed from a low-resistance state to a high-resistance state. FIG. 14 shows typical electrical characteristics. FIG. 14 is a chart showing the characteristics of the current that flows between ReRAMs when a voltage Vappl is applied between the ReRAMs.

As shown in FIG. 14, when the voltage Vappl is increased from 0 V while the ReRAMs are in a low-resistance state, the current increases proportionally. However, the resistance state becomes a high-resistance state at a set voltage Vsp, and the current flows little. After that, even if the voltage Vappl is increased, the high-resistance state is maintained, and the current does not flow. However, when the voltage Vappl reaches a reset voltage Vrp (>Vsp), the ReRAMs switch to a low-resistance state. In this unipolar-type memory, the same characteristics as above are obtained when a negative voltage is applied, as shown in FIG. 14. That is, the resistance state switches from a low-resistance state to a high-resistance state at a negative set voltage −Vsn, and the resistance state switches from a high-resistance state to a low-resistance state at a negative reset voltage −Vrn (<−Vsn).

Figure 15:
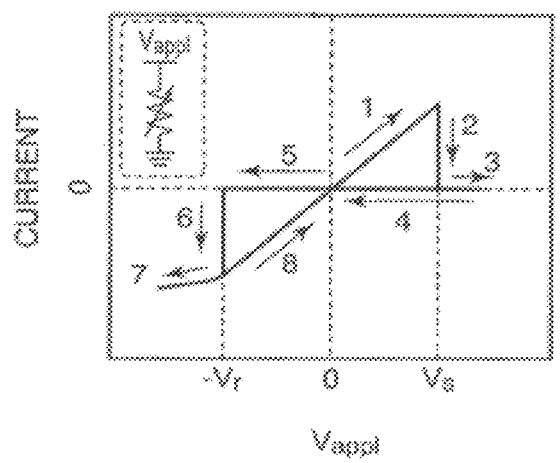
FIG. 15 is a diagram showing the characteristics of a bipolar-type ReRAM.

In a bipolar-type memory, on the other hand, the voltage porality differs between when the resistance state is changed from a low-resistance state to a high-resistance state and when the resistance state is changed from a high-resistance state to a low-resistance state. FIG. 15 shows typical electrical characteristics. FIG. 15 is a chart showing the characteristics of the current that flows between ReRAMs when a voltage Vappl is applied between the ReRAMs. As shown in FIG. 15, when the voltage Vappl is increased from 0 V while the ReRAMs are in a low-resistance state, the current increases proportionally. However, the resistance state becomes a high-resistance state at a set voltage Vs, and the current decreases significantly. In this state, even if the voltage Vappl is increased, the high-resistance state is maintained, and the current flows little. When the voltage Vappl is lowered and reaches a negative reset voltage −Vr, the ReRAMs switch from the high-resistance state to a low-resistance state. As the voltage Vappl is further varied after that, a current corresponding to the voltage Vappl flows in the ReRAMs. This state is maintained even when a negative voltage is applied, and does not change unless the positive voltage becomes higher than the set voltage Vs.

Figure 16:
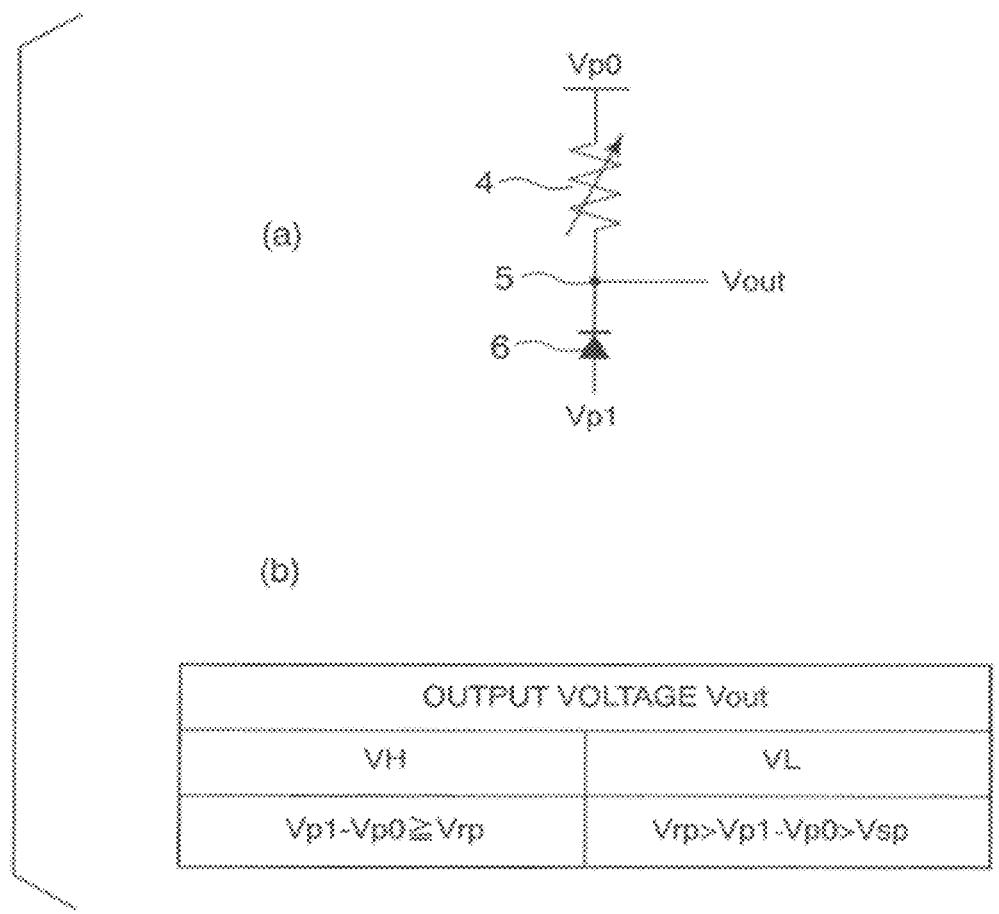
FIGS. 16(a) and 16(b) illustrate operations of the memory cell according to the first embodiment.

As a bipolar-type memory, a ReRAM having a structure of $Pt/TiO_2/TiN/Pt$ is known. Also, as a unipolar-type ReRAM, a ReRAM having a structure of $Al/TiO_2/Ru$ is known. In the memory cell according to this embodiment shown in FIG. 10(a), a voltage Vp0 is applied to one end of the ReRAM 4, and a voltage Vp1 is applied to the anode of the diode 6, as shown in FIG. 16(a). Programming is then performed. The ReRAMs used in this embodiment are preferably unipolar-type ReRAMs. This is because due to the diode 6, little voltages are applied to the ReRAM 4 unless Vp0 is lower than Vp1. Where the output Vout of the memory cell 1 is VH, the relationship between the program voltages Vp0 and Vp1 should satisfy Vp1−Vp0≧Vrp, so as to put the ReRAM 4 into a low-resistance state. Where the output Vout of the memory cell 1 is VL, the relationship between the program voltages Vp0 and Vp1 should satisfy Vrp>Vp1−Vp0>Vsp, so as to put the ReRAM 4 into a high-resistance state. The above results are shown in FIG. 16(b).

Example 1

Figure 17:
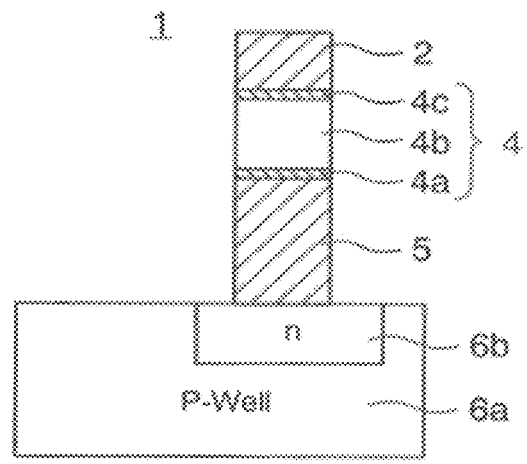
FIG. 17 is a cross-sectional view of a memory cell of Example 1 of the first embodiment.

FIG. 17 is a cross-sectional view showing a case where Example 1 of the memory cell 1 is manufactured. In the memory cell 1 of Example 1, a reverse-bias diode 6 is formed by using a P-well 6a on a silicon substrate and an N-type doped layer 6b formed in the P-well 6a. A wire layer to be an output terminal 5 is formed on the diode 6, and a ReRAM 4 is formed on the wire layer 5. The ReRAM 4 includes electrodes 4a and 4c made of Pt, for example, and a variable resistance layer 4b that is formed between the electrodes 4a and 4c and has a stack structure of $TiO_2/TiN$. An wire 2 to which the source voltage VDD is to be applied is formed on the ReRAM 4. This memory cell 1 of Example 1 is formed in an wire layer. The memory cell 1 of Example 1 can be formed in an area that is equal to or smaller than the area of one transistor. Since a SRAM is normally formed by six transistors, the area of a conventional FPGA can be made smaller by replacing SRAMs storing circuit information in the conventional FPGA with memory cells 1 of this example.

Example 2

Figure 18:
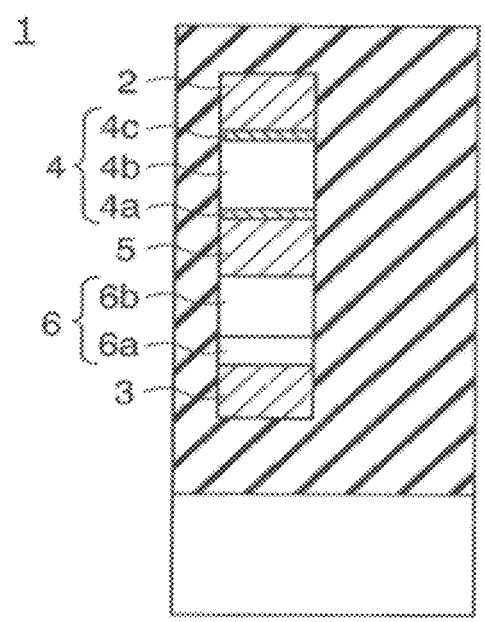
FIG. 18 is a cross-sectional view of a memory cell of Example 2 of the first embodiment.

FIG. 18 is a cross-sectional view showing a case where Example 2 of the memory cell 1 is manufactured. The memory cell 1 of Example 2 is formed in an interlayer insulating film formed on a silicon substrate. The memory cell 1 includes: a wire layer 3 to which the ground voltage is to be applied; a diode 6 that is provided on the wire layer 3 and is formed by stacking a P-type semiconductor layer 6a and an N-type semiconductor layer 6b in this order; an wire layer 5 that is formed on the diode 6 and is to be an output terminal; a ReRAM 4 that is formed on the wire layer 5 by stacking an electrode 4a, a variable resistance layer 4b, and an electrode 4c in this order; and a wire layer 2 that is formed on the ReRAM 4 and has the source voltage VDD to be applied thereto. In Example 2, the area of a FPGA can be made smaller by using memory cells 1 of this example, instead of SRAMs storing circuit information, as in Example 1.

Example 3

Figure 19:
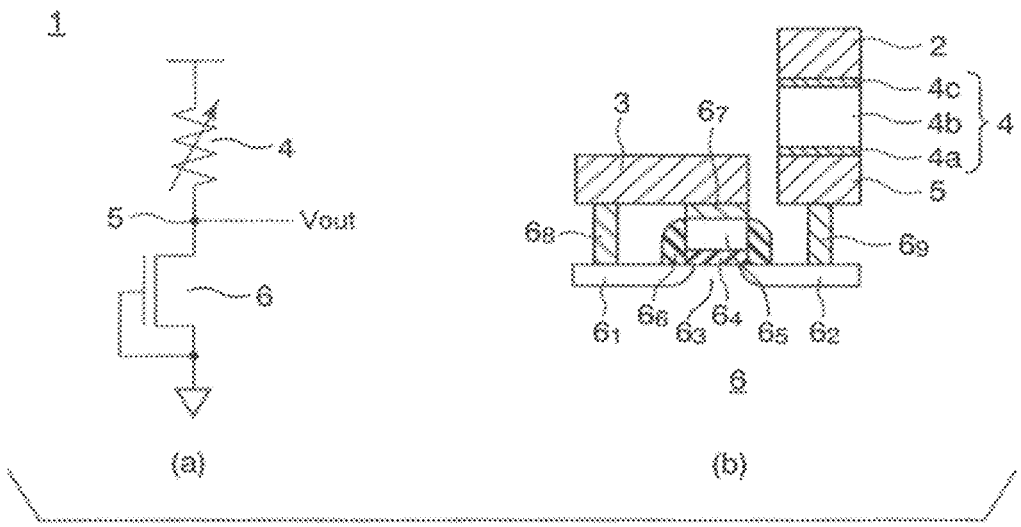
FIGS. 19(a) and 19(b) show a memory cell of Example 3 of the first embodiment.

FIG. 19(a) shows Example 3 of the memory cell 1 in which a diode-connected n-MOSFET is used as a diode 6. FIG. 19(b) is a cross-sectional view showing a case where the memory cell 1 of Example 3 is manufactured. The diode characteristics in a diode-connected n-MOSFET can be changed by varying the channel length or channel width of a transistor. Therefore, designing according to the characteristics of a ReRAM becomes advantageously easier. As shown in FIG. 19(b), in Example 3, the diode 6 includes: an N-type source region $6_1$ and drain region $6_2$ formed at a distance from each other in a P-type semiconductor substrate; a gate insulating film $6_4$ that is formed on a semiconductor region $6_3$ to be the channel between the source region $6_1$ and the drain region $6_2$; a gate electrode $6_5$ formed on the gate insulating film $6_4$; and gate sidewalls $6_6$ that are formed on the side portions of the gate electrode $6_5$ and are made of an insulating material. The gate electrode $6_5$ and the source region $6_1$ are connected to a wire 3 connected to a ground source, via plugs $6_7$ and $6_8$, respectively. The drain region $6_2$ is connected to a wire 5 to be an output terminal via a plug $6_9$. A ReRAM 4 having a stack structure formed by stacking an electrode 4a, a variable resistance 4b, and an electrode 4c is formed on the wire 5. A wire 2 to which the source voltage VDD is to be applied is formed on the ReRAM 4. In Example 3, a nonvolatile memory cell can be formed in an area equal to the area of a transistor. Accordingly, the area of a FPGA can be made smaller by using memory cells 1 of this example, instead of SRAMs storing circuit information.

Example 4

Figure 20:
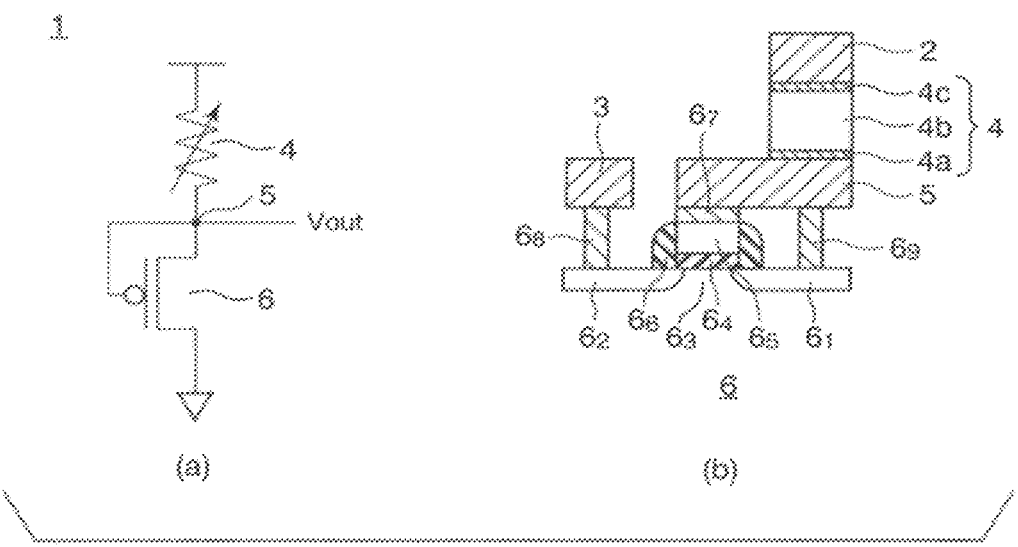
FIGS. 20(a) and 20(b) show a memory cell of Example 4 of the first embodiment.

FIG. 20(a) shows Example 4 in which a diode-connected p-MOSFET is used as a diode 6. FIG. 20(b) is a cross-sectional view showing a case where the memory cell 1 of Example 4 is manufactured. The diode characteristics in a diode-connected p-MOSFET can be changed by varying the channel length or channel width of a transistor. Therefore, designing according to the characteristics of a ReRAM becomes advantageously easier. As shown in FIG. 20(b), in Example 4, the diode 6 includes: a P-type source region $6_1$ and drain region $6_2$ formed at a distance from each other in an N-type semiconductor substrate; a gate insulating film $6_4$ that is formed on a semiconductor region $6_3$ to be the channel between the source region $6_1$ and the drain region $6_2$; a gate electrode $6_5$ formed on the gate insulating film $6_4$; and gate sidewalls $6_6$ that are formed on the side portions of the gate electrode $6_5$ and are made of an insulating material. The gate electrode $6_5$ and the source region $6_1$ are connected to a wire 5 to be an output terminal via plugs $6_7$ and $6_9$, respectively. The drain region $6_2$ is connected to a wire 3 connected to a ground source, via a plug $6_8$. A ReRAM 4 having a stack structure formed by stacking an electrode 4a, a variable resistance 4b, and an electrode 4c is formed on the wire 5. A wire 2 to which the source voltage VDD is to be applied is formed on the ReRAM 4.

In Example 4, a nonvolatile memory cell can be formed in an area equal to the area of a transistor. Accordingly, the area of a FPGA can be made smaller by using memory cells 1 of this example, instead of SRAMs storing circuit information.

Example 5

Figure 21:
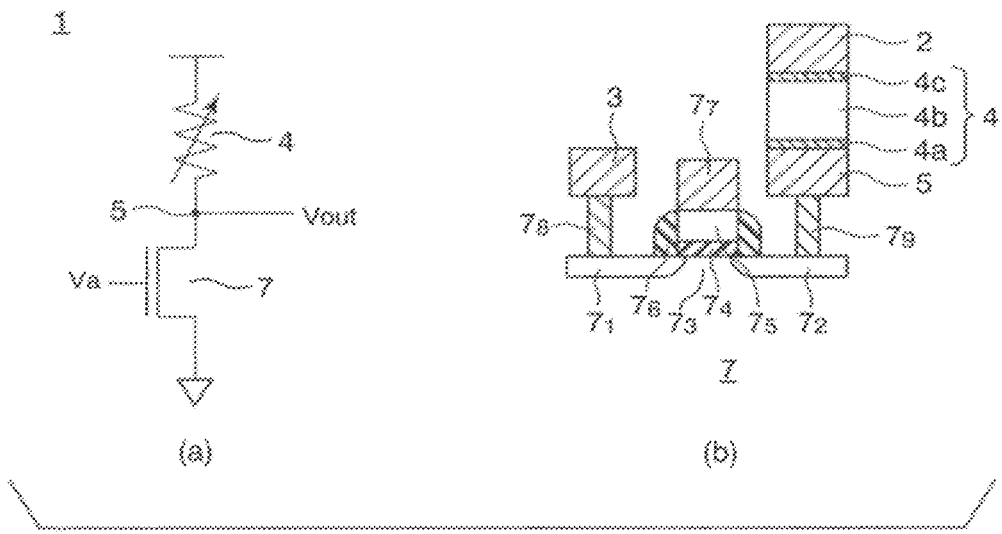
FIGS. 21(a) and 21(b) show a memory cell of Example 5 of the first embodiment.

FIG. 21(a) is a circuit diagram of Example 5 of the memory cell 1. FIG. 21(b) is a cross-sectional view showing a case where the memory cell 1 of this example is manufactured. In the memory cell 1 of Example 5, instead of a diode 6, an n-MOSFET 7 having a gate to which a control voltage Va is to be applied from outside is used. The conductivity of the n-MOSFET can be adjusted by the value of the control voltage Va, and designing of a ReRAM 4 and the n-MOSFET 7 can be made simpler. As shown in FIG. 21(b), the n-MOSFET 7 of Example 5 includes: an N-type source region $7_1$ and drain region $7_2$ formed at a distance from each other in a P-type semiconductor substrate; a gate insulating film $7_4$ that is formed on a semiconductor region $7_3$ to be the channel between the source region $7_1$ and the drain region $7_2$; a gate electrode $7_5$ formed on the gate insulating film $7_4$; and gate sidewalls $7_6$ that are formed on the side portions of the gate electrode $7_5$ and are made of an insulating material. The gate electrode $7_5$ is connected to a wire $7_7$ to which the control voltage Va is to be applied. The source region $7_1$ is connected to a wire 3 connected to a ground source, via a plug $7_8$. The drain region $7_2$ is connected to a wire 5 to be an output terminal via a plug $7_9$. The ReRAM 4 having a stack structure formed by stacking an electrode 4a, a variable resistance 4b, and an electrode 4c is formed on the wire 5. An wire 2 to which the source voltage VDD is to be applied is formed on the ReRAM 4.

In Example 5, a nonvolatile memory cell can also be formed in an area equal to the area of a transistor. Accordingly, the area of a FPGA can be made smaller by using memory cells 1 of this example, instead of SRAMs storing circuit information.

Example 6

Figure 22:
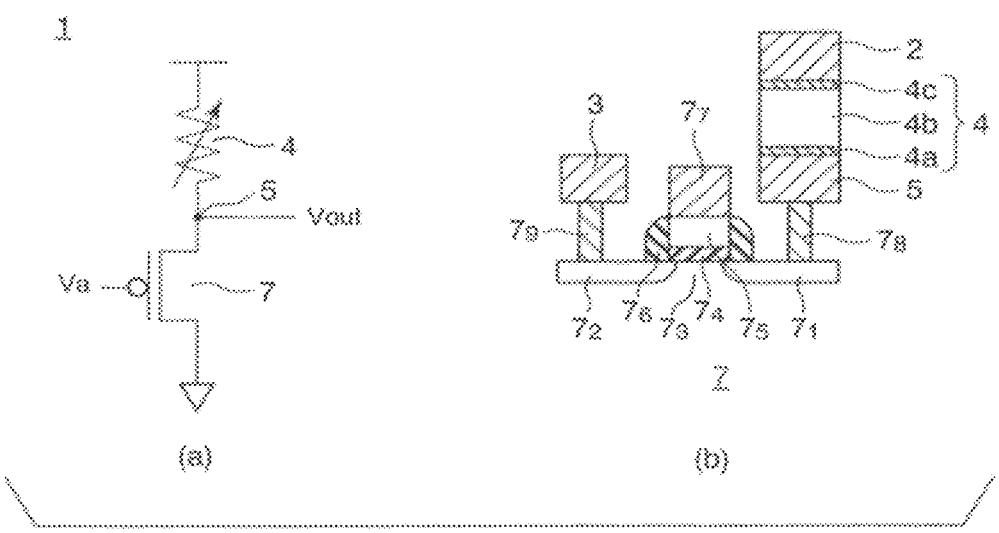
FIGS. 22(a) and 22(b) show a memory cell of Example 6 of the first embodiment.

FIG. 22(a) is a circuit diagram of Example 6 of the memory cell 1. FIG. 22(b) is a cross-sectional view showing a case where the memory cell 1 of this example is manufactured. In the memory cell 1 of Example 6, instead of a diode 6, a p-MOSFET 7 having a gate to which a control voltage Va is to be applied from outside is used. The conductivity of the p-MOSFET can be adjusted by the value of the control voltage Va, and designing of a ReRAM 4 and the p-MOSFET 7 can be made simpler. As shown in FIG. 22(b), the p-MOSFET 7 of Example 6 includes: a P-type source region $7_1$ and drain region $7_2$ formed at a distance from each other in an N-type semiconductor substrate; a gate insulating film $7_4$ that is formed on a semiconductor region $7_3$ to be the channel between the source region $7_1$ and the drain region $7_2$; a gate electrode $7_5$ formed on the gate insulating film $7_4$; and gate sidewalls $7_6$ that are formed on the side portions of the gate electrode $7_5$ and are made of an insulating material. The gate electrode $7_5$ is connected to a wire $7_7$ to which the control voltage Va is to be applied. The source region $7_1$ is connected to a wire 5 to be an output terminal via a plug $7_8$. The drain region $7_2$ is connected to an wire 3 connected to a ground source, via a plug $7_9$. The ReRAM 4 having a stack structure formed by stacking an electrode 4a, a variable resistance 4b, and an electrode 4c is formed on the wire 5. A wire 2 to which the source voltage VDD is to be applied is formed on the ReRAM 4.

In Example 6, a nonvolatile memory cell can also be formed in an area equal to the area of a transistor. Accordingly, the area of a FPGA can be made smaller by using memory cells 1 of this example, instead of SRAMs storing circuit information.

Example 7

Figure 23:
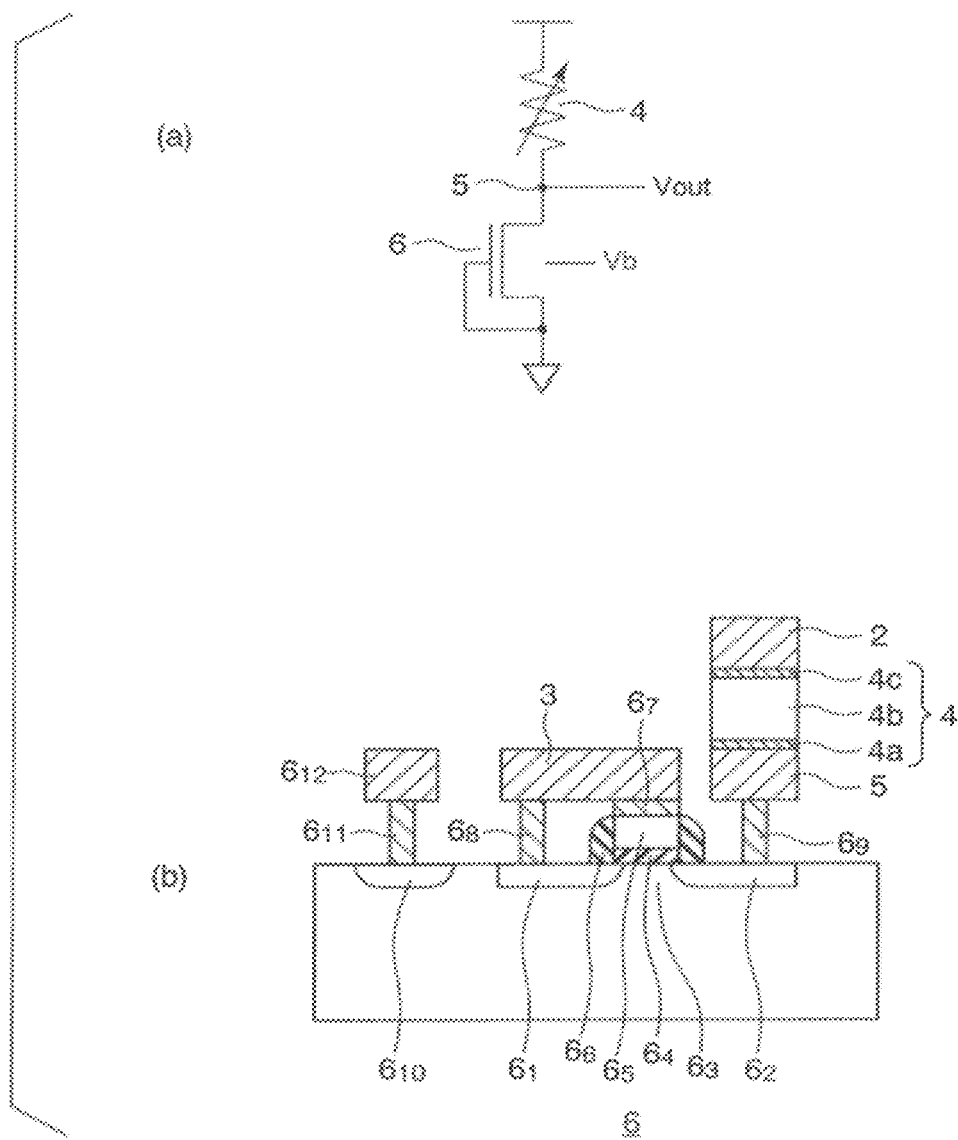
FIGS. 23(a) and 23(b) show a memory cell of Example 7 of the first embodiment.

FIG. 23(a) is a circuit diagram of the memory cell 1 of Example 7. FIG. 23(b) is a cross-sectional view showing a case where the memory cell 1 of this example is manufactured. The memory cell 1 of Example 7 is the same as the memory cell 1 of Example 3 illustrated in FIGS. 19(a) and 19(b), except that a control voltage Vb from outside is supplied as the substrate voltage of an n-MOSFET 6. The conductivity of the n-MOSFET can be adjusted by the control voltage Vb. With this structure, designing of a ReRAM 4 and the n-MOSFET 6 can be made simpler. In Example 7, a substrate contact $6_{10}$ to which the control voltage Vb is to be applied is formed in the substrate, and the substrate contact $6_{10}$ is connected to a wire $6_{12}$ to which the control voltage Vb is to be applied, via a plug $6_{11}$.

In this example, a nonvolatile memory cell as the memory cell 1 can also be formed in an area equal to the area of a transistor, as in Example 3. Accordingly, the area of a FPGA can be made smaller by using memory cells 1 of this example, instead of SRAMs storing circuit information.

Example 8

Figure 24:
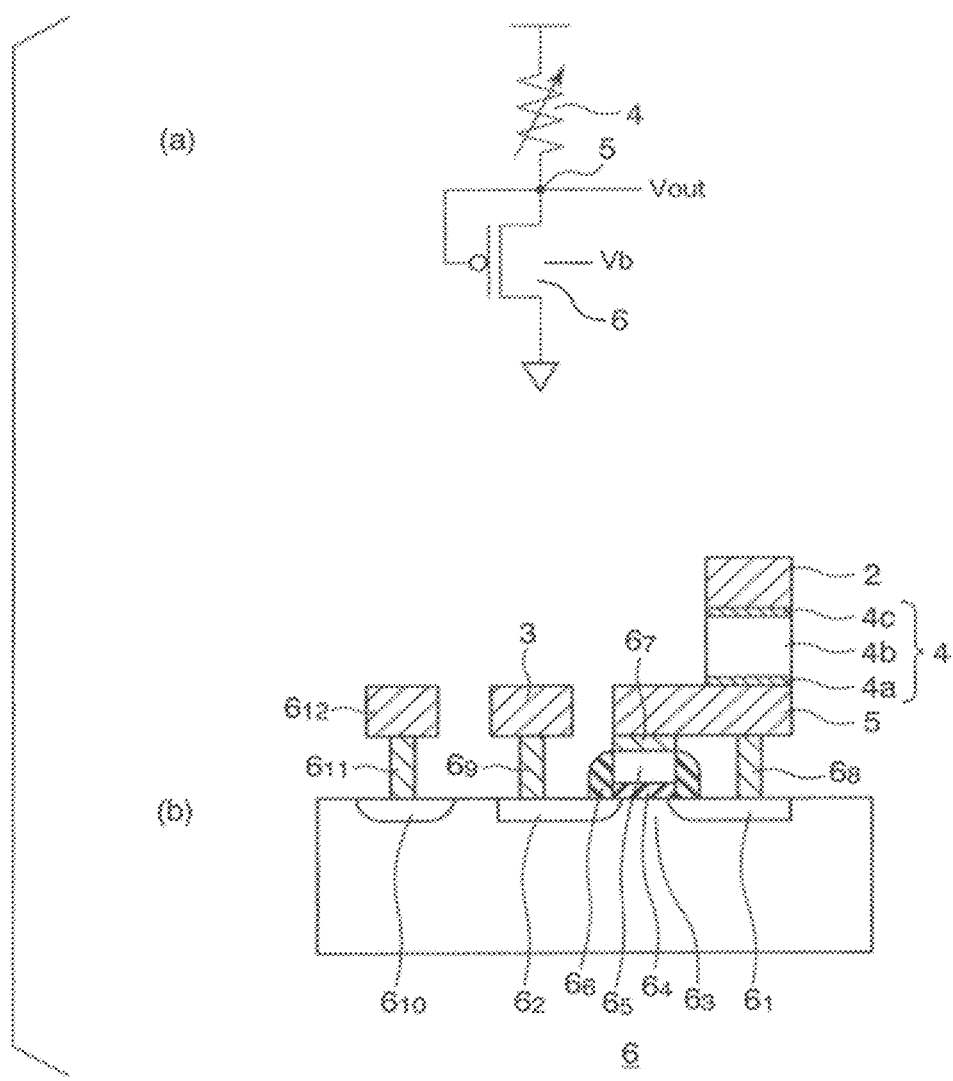
FIGS. 24(a) and 24(b) show a memory cell of Example 8 of the first embodiment.

FIG. 24(a) is a circuit diagram of the memory cell 1 of Example 8. FIG. 24(b) is a cross-sectional view showing a case where the memory cell 1 of this example is manufactured. The memory cell 1 of Example 8 is the same as the memory cell 1 of Example 4 illustrated in FIGS. 20(a) and 20(b), except that a control voltage Vb from outside is supplied as the substrate voltage of a p-MOSFET 6. The conductivity of the p-MOSFET can be adjusted by the control voltage Vb. With this structure, designing of a ReRAM 4 and the p-MOSFET 6 can be made simpler. In Example 8, a substrate contact $6_{10}$ to which the control voltage Vb is to be applied is formed in the substrate, and the substrate contact $6_{10}$ is connected to a wire $6_{12}$ to which the control voltage Vb is to be applied, via a plug $6_{11}$.

In this example, a nonvolatile memory cell as the memory cell 1 can also be formed in an area equal to the area of a transistor, as in Example 4. Accordingly, the area of a FPGA can be made smaller by using memory cells 1 of this example, instead of SRAMs storing circuit information.

Figure 25:
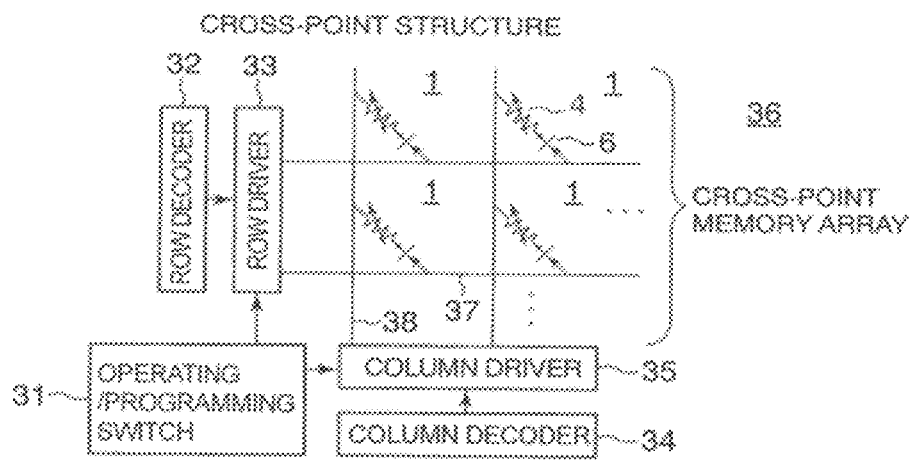
FIG. 25 is a circuit diagram illustrating a case where memory cells according to the first embodiment are used as memories for a FPGA.

FIG. 25 shows a circuit structure formed in a case where memory cells 1 of this embodiment are used as memories to store the circuit information of a FPGA. Memory operations of the FPGA can be divided into programming and a circuit operating state. Programming is writing the circuit configuration into the memories. The circuit operating state is a state in which the FPGA operates in accordance with the values written in the memories. To switch between the programming state and the operating state, this embodiment includes an operating/programming switch circuit 31, a row decoder 32, a row driver 33, a column decoder 34, a column driver 35, and a cross-point memory array 36. The cross-point memory array 36 includes nonvolatile memory cells 1 arranged in a matrix fashion. One end of each memory cell 1 is connected to a row address line 37, and the other end is connected to a column address line 38.

Figure 26:
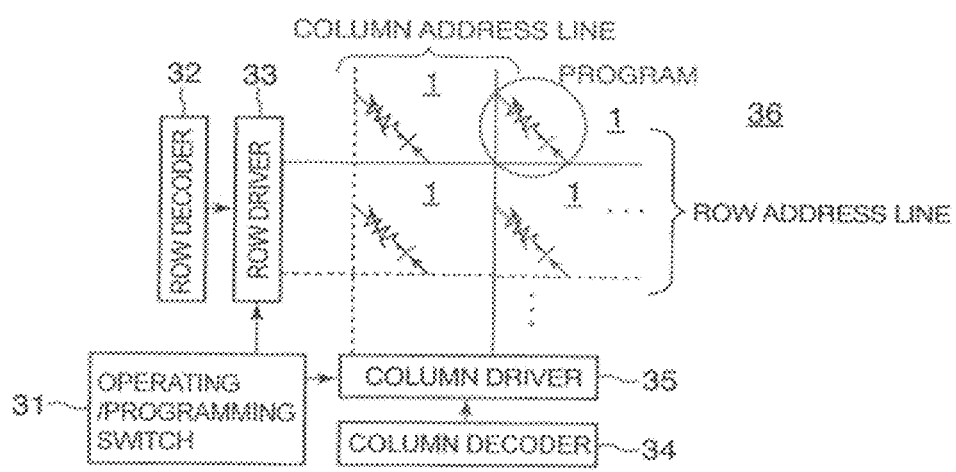
FIG. 26 is a diagram for explaining an operation of the circuit illustrated in FIG. 25.

First, the programming method is described. As shown in FIG. 26, in the programming state, the operating/programming switch circuit 31 activates the row decoder 32 and the column decoder 34. The row decoder 32 selects one row address line 37 via the row driver 33, and the column decoder 34 selects one column address line 38 via the column driver 35. The row driver 33 and the column driver 35 each output a program voltage to the row address line 37 and the column address line 38. Through this control operation, the program voltage is selectively supplied to one of the memory cells 1, and the one memory cell 1 is programmed. This is repeated for the respective memory cells 1, so that all the memory cells 1 in the cross-point memory array can be programmed. When the same value is to be written into all the memory cells to perform resetting, the row driver 33 and the column driver 35 output the program voltages to all the row address lines and all the column address lines, respectively. In this manner, all the memory cells can be collectively reset.

Figure 27:
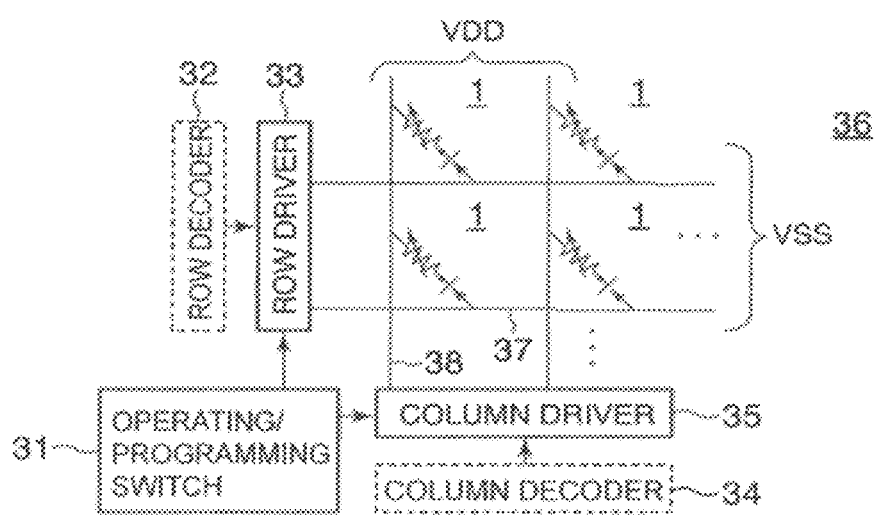
FIG. 27 is a diagram for explaining an operation of the circuit illustrated in FIG. 25.

Next, the circuit operating state is described. As shown in FIG. 27, in the circuit operating state, the operating/programming switch circuit 31 controls the row driver 33 and the column driver 35 to output VDD and VSS to all the row address lines 37 and all the column address lines 38. Through this control, the respective memory cells 1 output VH or VL in accordance with the programmed states.

Next, a specific example of each of the operating/programming switch circuit 31, the row decoder 32, the column decoder 34, the row driver 33, and the column driver 35 is described.

Figure 28:
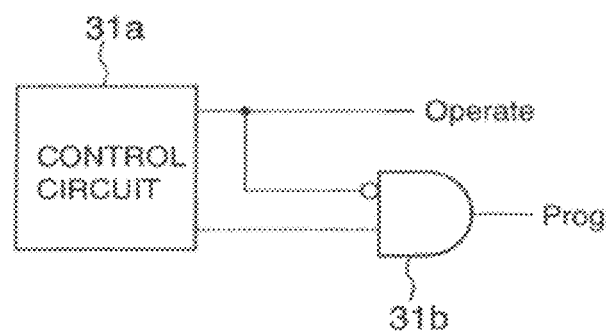
FIG. 28 is a circuit diagram showing a specific example of an operating/programming switch circuit.

FIG. 28 shows a specific example of the operating/programming switch circuit 31. When the operating/programming switch circuit 31 is in an operating state, a control circuit 31a outputs "H" level to a control signal Operate. When the operating/programming switch circuit 31 is in a programming state, the control circuit 31a outputs the "H" level to a control signal Prog via an AND circuit 31b. The AND circuit 31b is used so that the control signal Operate and the control signal Prog are not switched to the "H" level at the same time.

Figure 29:
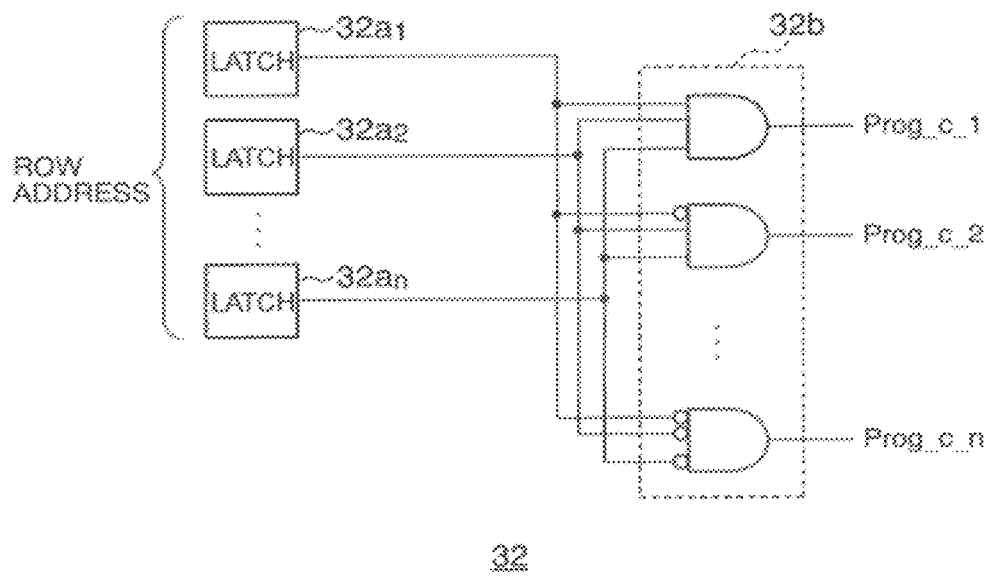
FIG. 29 is a circuit diagram showing a specific example of a row decoder.

FIG. 29 is a circuit diagram showing a specific example of the row decoder 32. The row decoder 32 includes latch circuits $32a_1$ through $32a_n$ (n denotes for the number of row lines) for storing a row address, and a decode circuit 32b that outputs the "H" level only to the address Prog_c_m (m=1, 2, ..., n) designated by the latch circuits $32a_1$ through $32a_n$.

Figure 30:
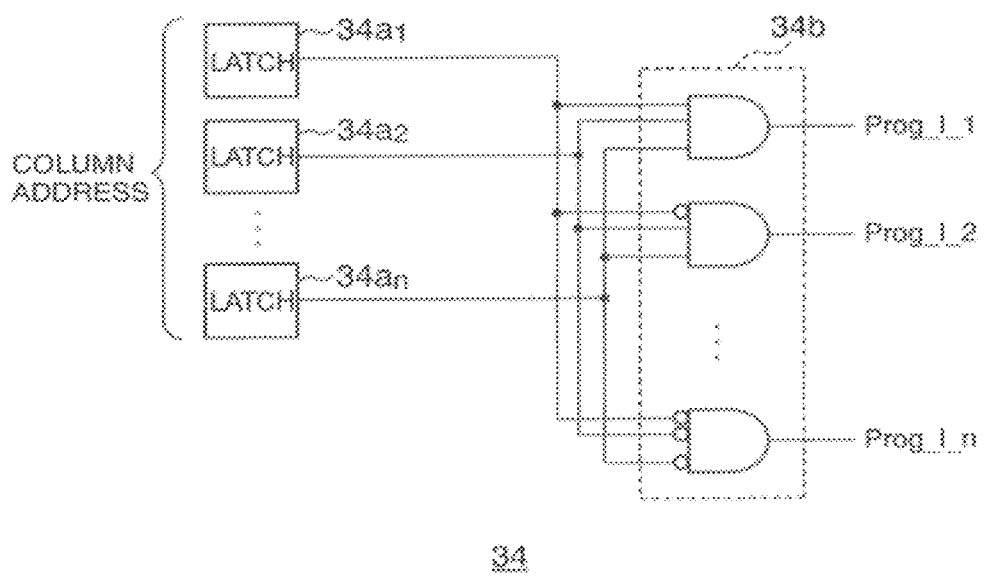
FIG. 30 is a circuit diagram showing a specific example of a column decoder.

FIG. 30 is a circuit diagram showing a specific example of the column decoder 34. The column decoder 34 includes latch circuits $34a_1$ through $34a_n$ (n denotes for the number of column lines) for storing a column address, and a decode circuit 34b that outputs the "H" level only to the address Prog_l_m (m=1, 2, ..., n) designated by the latch circuits $34a_1$ through $34a_n$.

Figure 31:
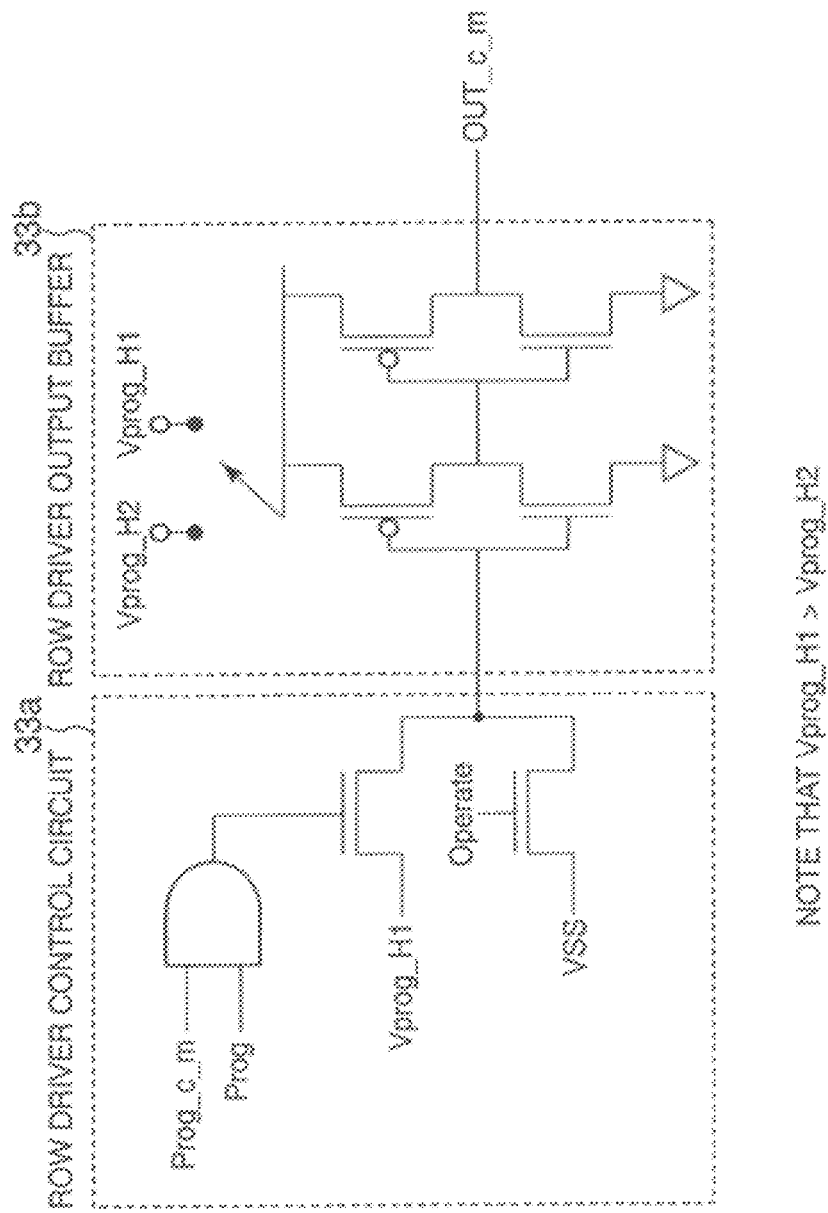
FIG. 31 is a circuit diagram showing a specific example of a row driver.

FIG. 31 is a circuit diagram showing a specific example of the row driver 33. The row driver 33 includes a row driver control circuit 33a and a row driver output buffer 33b. The output of the row driver 33 is an output signal OUT_c_m. Here, m is 1, 2, ..., n_r, where n_r represents the total number of rows in the memory cell array 36. When the circuit 31 is in an operating state, the "H" level is input to the control signal Operate, and "L" level is input to the control signal Prog in the row driver control circuit 33a. Therefore, the output of the row driver control circuit 33a is the ground potential (VSS), and the output signal OUT_c_m also becomes the ground potential. In a programming state, on the other hand, the "L" level is input to the control signal Operate, and the "H" level is input to the control signal Prog. Further, when a memory cell 1 on the mth row in the memory cell array 36 is to be programmed, the "H" level is input to the signal Prog_c_m. Here, the output of the row driver control circuit 33a is a signal Vprog_H1. At this point, the source voltage of the row driver output buffer 33b is selectively set at Vprog_H2 or Vprog_H1 in accordance with the value to be written into the memory cell 1. Accordingly, one of the signal Vprog_H2 and the signal Vprog_H1 is output to the output signal OUT_c_m in accordance with the value to be written into the memory cell 1.

Figure 32:
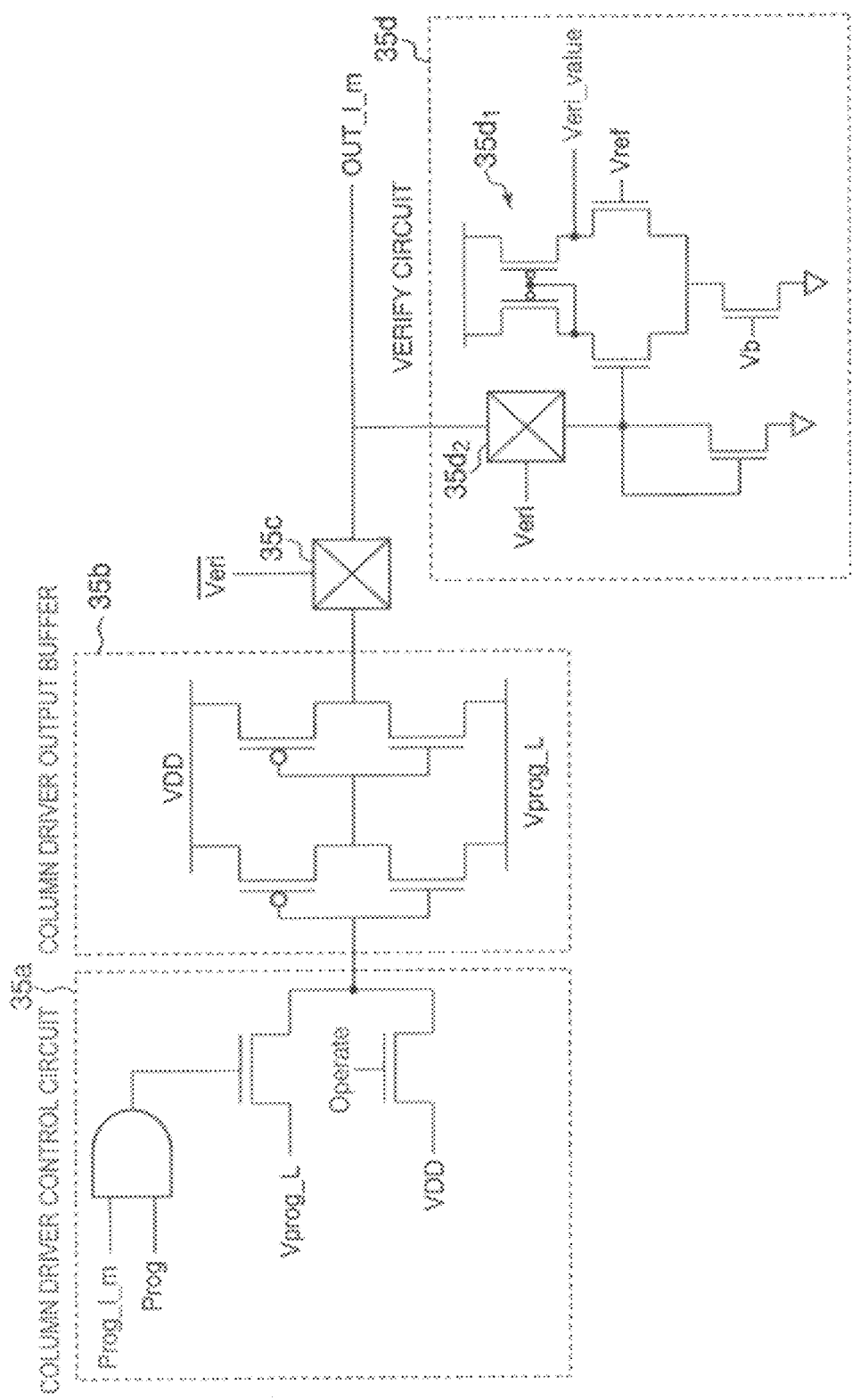
FIG. 32 is a circuit diagram showing a specific example of a column driver.

FIG. 32 is a circuit diagram showing a specific example of the column driver 35. The column driver 35 includes a column driver control circuit 35a, a column driver output buffer 35b, a transfer gate 35c, and a verify circuit 35d. The output of the column driver 35 is an output signal OUT_l_m. Here, m is 1, 2, ..., n_c, where n_c represents the total number of column in the memory cell array 36. When the circuit 31 is in an operating state, the "H" level is input to the control signal Operate, and the "L" level is input to the control signal Prog in the column driver control circuit 35a.

Therefore, the output of the column driver control circuit 35a is the source voltage (VDD). When the circuit 31 is in an operating state or a programming state, a signal Veri is at the "L" level. Therefore, the output signal OUT_l_m is also the source potential. When the circuit 31 is in a programming state, on the other hand, the "L" level is input to the control signal Operate, and the "H" level is input to the control signal Prog. Further, when a memory cell 1 on the mth column in the memory cell array 36 is to be programmed, the "H" level is input from the row decoder 32 to the control signal Prog_l_m. Therefore, a program voltage Vprog_L is output from the output signal OUT_l_m. When the value written in the memory cell 1 is to be checked, the signal Veri is set at the "H" level. As a result, a sense amplifier $35d_1$ of the verify circuit 35d compares the potential of a reference signal Vref and the potential of the output signal OUT_l_m input via a transfer gate $35d_2$. The result of the comparison is output as a verify signal Veri_Value from the sense amplifier $35d_1$. Since the potential of the output signal OUT_l_m varies depending on the value written in the memory cell 1, the value written in the memory cell 1 can be recognized.

Above explanation assume that when memory cells are programmed, column driver supplies fixed voltage and row driver supplies programming voltage according to the data to be written in memories. It is possible to program memory cells by row driver supplies fixed voltage and column driver supplies programming voltage according to the data to be written in memories.

As described so far, according to this embodiment, a nonvolatile memory that has the smallest possible area can be obtained. If the nonvolatile memory of this embodiment is used in place of SRAMs storing circuit information, a reconfigurable logic circuit that can minimize the area of a FPGA can be obtained.

Second Embodiment

Figure 33:
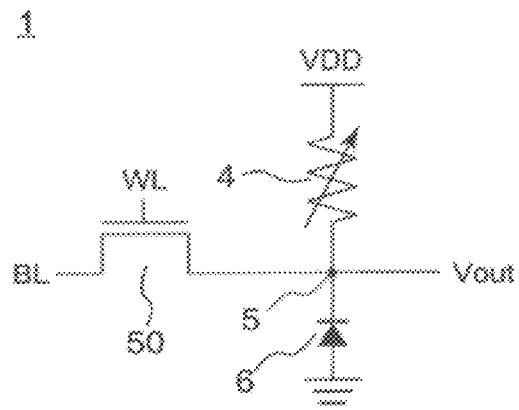
FIG. 33 is a circuit diagram showing a nonvolatile memory according to a second embodiment.

Referring now to FIG. 33, a nonvolatile memory according to a second embodiment of the present invention is described. The nonvolatile memory of this embodiment includes at least one nonvolatile memory cell 1, and the memory cell 1 is the same as the memory cell of the first embodiment shown in FIG. 10(a), except that a programming transistor 50 is provided in the memory cell 1. One end of the transistor 50 is connected to a bit line BL, and the other end is connected to a common connection node between a ReRAM 4 and a diode 6, or to an output terminal 5. The gate of the transistor 50 is connected to a word line WL. The memory cell 1 of the second embodiment operates in the same manner as the memory cell of the first embodiment described with reference to FIGS. 10(b) and 10(c), so that the output voltage Vout can be VH or VL. Accordingly, memory cells 1 of this embodiment can be used, instead of SRAMs storing the circuit information about a FPGA.

Figure 34:
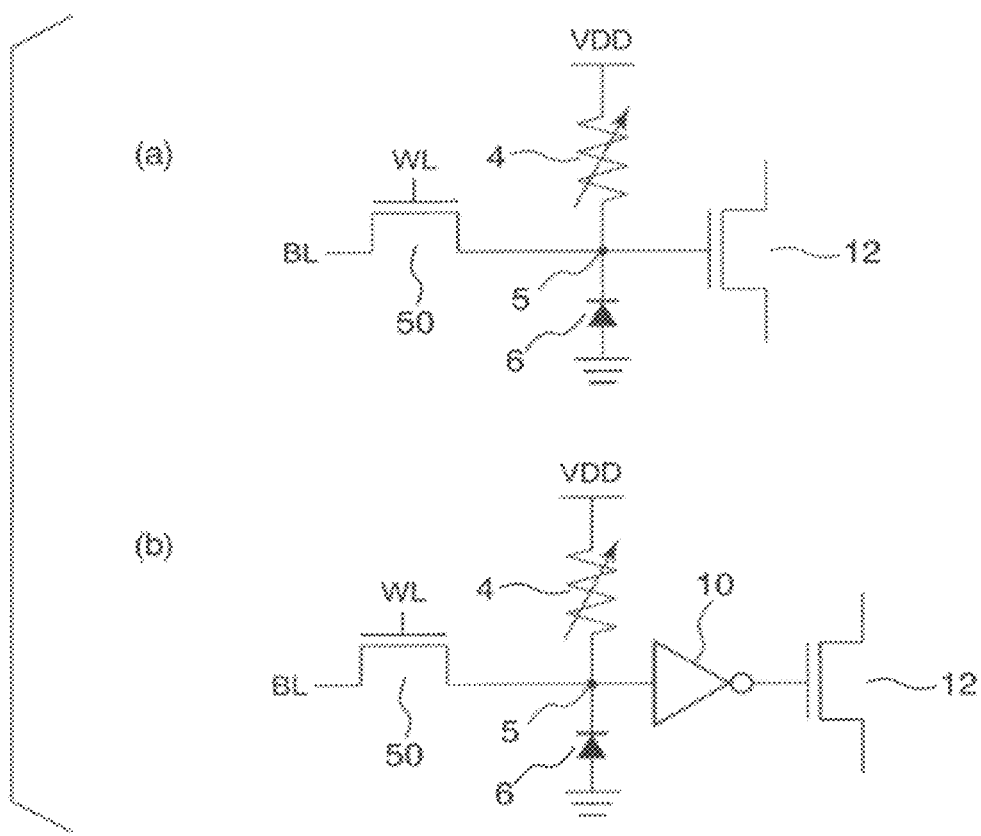
FIGS. 34(a) and 34(b) are circuit diagrams showing a specific example of a circuit element using a memory cell according to the second embodiment.

FIG. 34(a) shows a first specific example of a circuit element using the memory cell 1 according to this embodiment, and FIG. 34(b) shows a second specific example of a circuit element using the memory cell 1. In the circuit element of the first specific example shown in FIG. 34(a), a pass transistor 12 having its gate connected to the output terminal 5 of the memory cell 1 according to the second embodiment is provided. The circuit element of this specific example can replace a circuit element in a conventional FPGA, such as a circuit or a three-state buffer circuit having a SRAM connected to the gate of the pass transistor, for example.

The circuit element of the second specific example shown in FIG. 34(b) is the same as the circuit element of the first specific example, except that an inverter 10 is provided between the memory cell 1 and the pass transistor 12. With the inverter 10, a sufficiently high voltage can be supplied to the gate of the pass transistor 12, even when the output of the memory cell 1 is not sufficiently high due to the program voltage conditions of the ReRAM 4.

Next, a method of programming the memory cell 1 according to the second embodiment is described.

Figure 35:
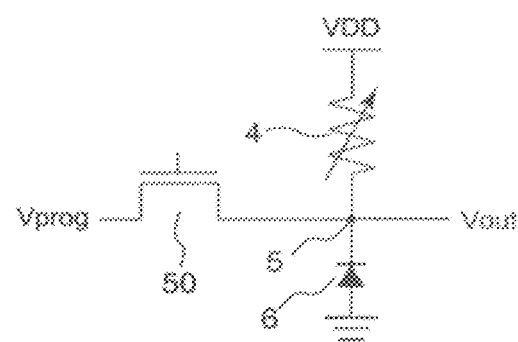
FIGS. 35(a) and 35(b) are diagrams for explaining a method of programming a memory cell according to the second embodiment.

FIG. 35(a) is a diagram showing a case where a program voltage Vprog is supplied to the memory cell 1 shown in FIG. 33. The memory cell 1 shown in FIG. 33 can be used as a unipolar-type ReRAM 4 or a bipolar-type ReRAM 4.

First, a case where a unipolar-type ReRAM 4 is used is described. When the output voltage Vout is to be made VH, or when the ReRAM 4 is to be put into a low-resistance state, the following relationship is satisfied: VDD−Vprog≧Vrp, or VDD−Vprog≦−Vrn (FIG. 35(b)). Here, Vrp and −Vrn represent respectively the positive reset voltage and the negative reset voltage described with reference to FIG. 14. When the output voltage Vout is to be made VL, or when the ReRAM 4 is to be put into a high-resistance state, the following relationship is satisfied: Vrp>VDD−Vprog>Vsp, or −Vsn>VDD−Vprog>−Vrn (FIG. 35(b)). Here, Vsp and −Vsn represent respectively the positive set voltage and the negative set voltage described with reference to FIG. 14.

Next, a case where a bipolar-type ReRAM 4 is used is described. As shown in FIG. 35(b), when the output voltage Vout is to be made VH, or when the ReRAM 4 is to be put into a low-resistance state, the following relationship is satisfied: VDD−Vprog>Vs. When the output voltage Vout is to be made VL, or when the ReRAM 4 is to be put into a high-resistance state, the following relationship is satisfied: VDD−Vprog<−Vr. Here, Vs and Vr represent respectively the set voltage and the reset voltage described with reference to FIG. 15.

Example 1

Figure 36:
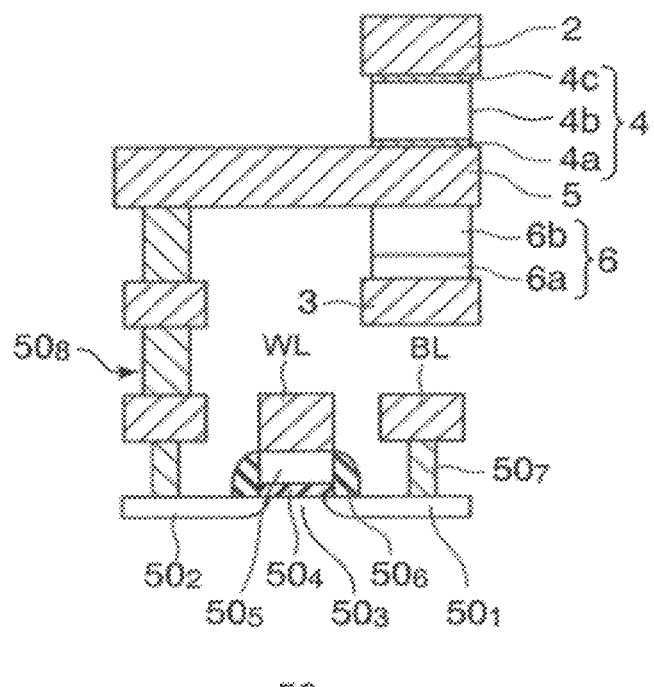
FIG. 36 is a cross-sectional view of a memory cell of Example 1 of the second embodiment.

FIG. 36 is a cross-sectional view showing a case where Example 1 of the memory cell 1 is manufactured. A programming transistor 50 in the memory cell 1 of Example 1 includes: an N-type source region $50_1$ and drain region $50_2$ formed at a distance from each other in a P-type semiconductor substrate; a gate insulating film $50_4$ that is formed on a semiconductor region $50_3$ to be the channel between the source region $50_1$ and the drain region $50_2$; a gate electrode $50_5$ formed on the gate insulating film $50_4$; and gate sidewalls $50_6$ that are formed on the side portions of the gate electrode $50_5$ and are made of an insulating material. The gate electrode $50_5$ is connected to a word line WL, and the source region $50_1$ is connected to a bit line BL via a plug $50_7$. The drain $50_2$ is connected to a wire 5 to be an output terminal 5 via a plug $50_8$. An wire 3 connected to a ground source is provided below the wire 5, and a diode 6 formed by stacking a P-type semiconductor layer 6a and an N-type semiconductor layer 6b in this order is provided between the wire 3 and the wire 5. A ReRAM 4 having a stack structure formed by stacking an electrode 4a, a variable resistance 4b, and an electrode 4c is formed on the wire 5. A wire 2 to which the source voltage VDD is to be applied is formed on the ReRAM 4.

In Example 1, a nonvolatile memory cell can be formed in an area equal to the area of a transistor. Accordingly, the area of a FPGA can be made smaller by using this nonvolatile memory, instead of SRAMs storing circuit information.

Example 2

Figure 37:
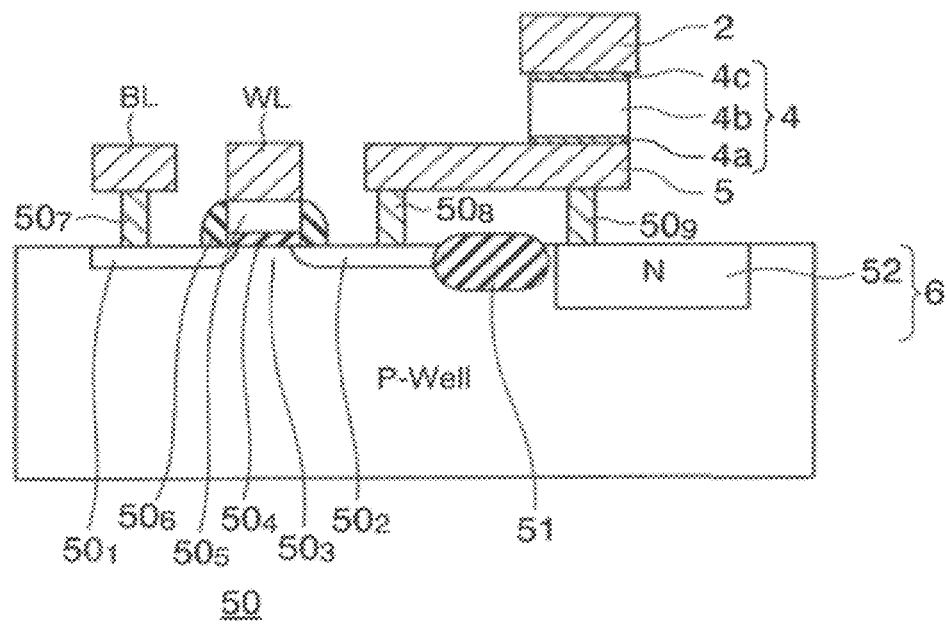
FIG. 37 is a cross-sectional view of a memory cell of Example 2 of the second embodiment.

FIG. 37 is a cross-sectional view showing a case where Example 2 of the memory cell 1 is manufactured. A programming transistor 50 in the memory cell 1 of Example 2 includes: an N-type source region $50_1$ and drain region $50_2$ formed at a distance from each other in a P-well region; a gate insulating film $50_4$ that is formed on a P-well region $50_3$ to be the channel between the source region $50_1$ and the drain region $50_2$; a gate electrode $50_5$ formed on the gate insulating film $50_4$; and gate sidewalls $50_6$ that are formed on the side portions of the gate electrode $50_5$ and are made of an insulating material. The gate electrode $50_5$ is connected to a word line WL, and the source region $50_1$ is connected to a bit line BL via a plug $50_7$. The drain $50_2$ is connected to a wire 5 via a plug $50_8$. The wire 5 is also connected to an N-type semiconductor region 52 formed on the opposite side of a device isolation region 51 formed in the P-well region from the transistor 50 in the P-well region.

A diode 6 is formed by the P-well region and the N-type semiconductor region 52. A ReRAM 4 having a stack structure formed by stacking an electrode 4a, a variable resistance 4b, and an electrode 4c is formed on the wire 5. A wire 2 to which the source voltage VDD is to be applied is formed on the ReRAM 4.

In Example 2, a nonvolatile memory cell can be formed in an area equal to the total area of two transistors. Accordingly, the area of a FPGA can be made smaller by using this nonvolatile memory, instead of SRAMs storing circuit information.

Example 3

Figure 38:
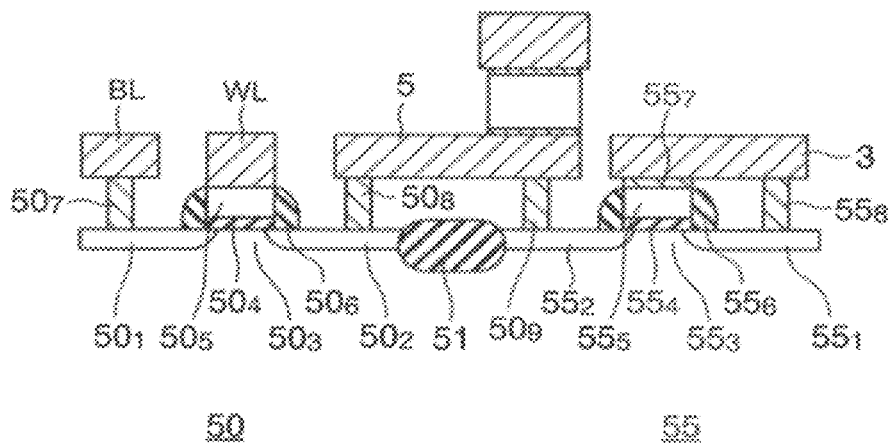
FIG. 38 is a cross-sectional view of a memory cell of Example 3 of the second embodiment.

FIG. 38 is a cross-sectional view showing a case where Example 3 of the memory cell 1 is manufactured. A programming transistor 50 in the memory cell 1 of Example 3 includes: an N-type source region $50_1$ and drain region $50_2$ formed at a distance from each other in a P-type semiconductor substrate; a gate insulating film $50_4$ that is formed on a semiconductor region $50_3$ to be the channel between the source region $50_1$ and the drain region $50_2$; a gate electrode $50_5$ formed on the gate insulating film $50_4$; and gate sidewalls $50_6$ that are formed on the side portions of the gate electrode $50_5$ and are made of an insulating material. The gate electrode $50_5$ is connected to a word line WL, and the source region $50_1$ is connected to a bit line BL via a plug $50_7$. The drain $50_2$ is connected to a wire 5 to be an output terminal 5 via a plug $50_8$. A ReRAM 4 having a stack structure formed by stacking an electrode 4a, a variable resistance 4b, and an electrode 4c is formed on the wire 5. A wire 2 to which the source voltage VDD is to be applied is formed on the ReRAM 4. Further, the wire 5 is connected to the drain $55_2$ of a diode-connected n-MOSFET 55 that is formed in a semiconductor substrate region on the opposite side of a device isolation region 51 formed in the P-type semiconductor substrate from the transistor 50. The MOSFET 55 includes: an N-type source region $55_1$ and drain region $55_2$ formed at a distance from each other in the P-type semiconductor substrate; a gate insulating film $55_4$ that is formed on a semiconductor region $55_3$ to be the channel between the source region $55_1$ and the drain region $55_2$; a gate electrode $55_5$ formed on the gate insulating film $55_4$; and gate sidewalls $55_6$ that are formed on the side portions of the gate electrode $55_5$ and are made of an insulating material. The gate electrode $55_5$ is connected to a wire 3 connected to a ground source, via a plug $55_7$. The wire 3 is also connected to the source region $55_1$ via a plug $55_8$.

In Example 3, a nonvolatile memory cell can be formed in an area equal to the total area of two transistors. Accordingly, the area of a FPGA can be made smaller by using this nonvolatile memory, instead of SRAMs storing circuit information.

Figure 39:
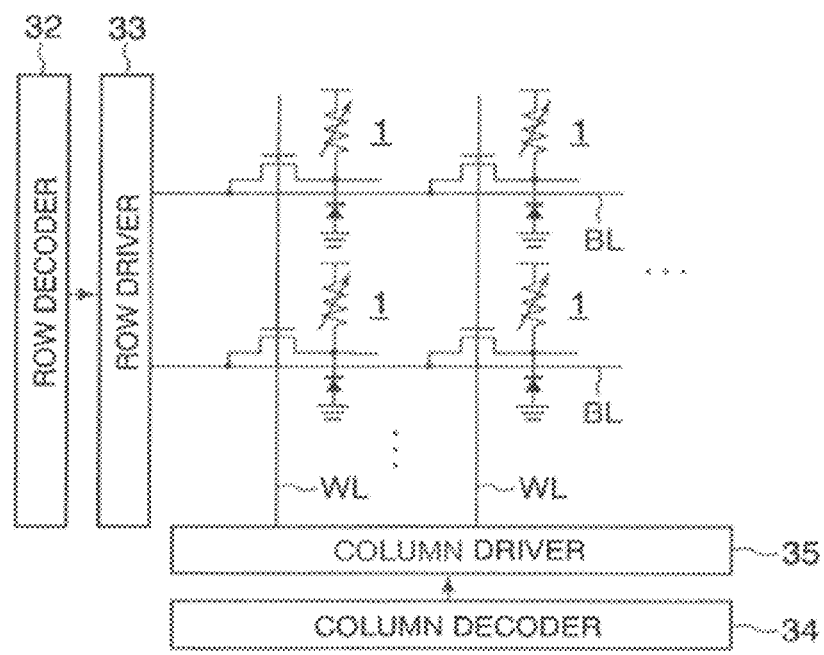
FIG. 39 is a circuit diagram illustrating a case where memory cells according to the second embodiment are used as memories for a FPGA.

FIG. 39 shows a structure formed in a case where a nonvolatile memory of the second embodiment is used as the memory to store the circuit information about a FPGA. As the circuits for programming, a row driver 33, a row decoder 32, a column driver 35, and a column decoder 34 are provided.

This structure differs from the circuits for programming according to the first embodiment shown in FIG. 25, in that a power supply circuit independently supplies power to the memory cells 1. Therefore, the circuits for programming are independent of the memory circuit in the second embodiment. Accordingly, the structure of this embodiment can also be used as a dynamic reconfigurable circuit.

Figure 40:
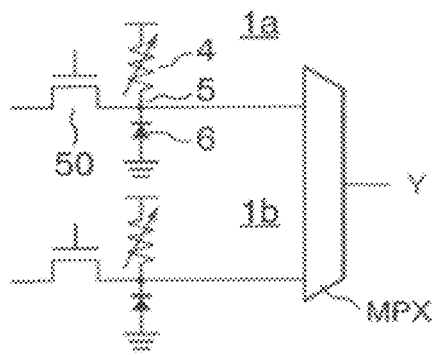
FIG. 40 is a circuit diagram showing a case where memory cells according to the second embodiment are used as a dynamic reconfigurable circuit.

FIG. 40 shows a circuit structure formed in a case where a nonvolatile memory of the second embodiment is used as a dynamic reconfigurable circuit. The circuit structure includes two memory cells 1a and 1b that are the same as the memory cell according to the second embodiment shown in FIG. 33, and the outputs of those memory cells are input to a multiplexer MPX. The multiplexer MPX selects the output of one of the memory cells 1, and outputs the selected output to an output terminal Y.

Figure 41:
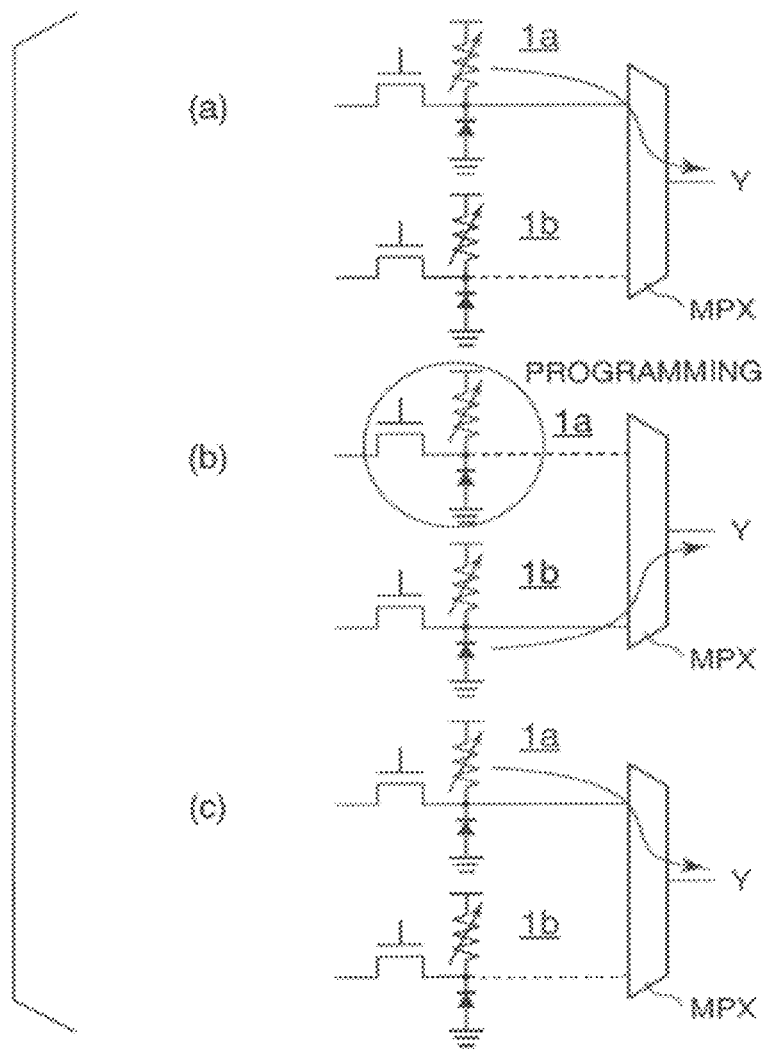
FIGS. 41(a), 41(b), and 41(c) are diagrams for explaining operations of the circuit illustrated in FIG. 40.

Referring now to FIGS. 41(a), 41(b), and 41(c), operations of the dynamic reconfigurable circuit shown in FIG. 40 are described. In the initial state, the same value is written in the two memory cells 1a and 1b, and the output of the upper memory cell 1a is output to the output terminal Y (FIG. 41(a)). When the value output from the output terminal Y is to be changed, the value in the lower memory cell 1b is made to be output from the multiplexer MPX, and the value in the upper memory cell 1a is rewritten (FIG. 41(b)). In this manner, the influence of the rewriting of the upper memory cell 1a on the memory cell 1b can be eliminated. After the value in the upper memory cell 1a is rewritten, the output of the upper memory cell 1a is output from the multiplexer MPX to the output terminal Y, and the value in the lower memory cell 1b is changed to the same value as the value in the upper memory cell 1a (FIG. 41(c)).

As described above, according to this embodiment, a nonvolatile memory that can have the smallest possible area can be obtained. Also, if a nonvolatile memory of this embodiment is used in place of SRAMs storing circuit information, a reconfigurable logic circuit that can minimize the area of a FPGA can be obtained.

Third Embodiment

Figure 42:
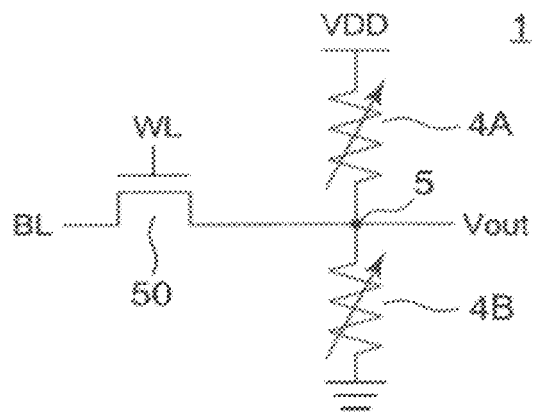
FIG. 42 is a circuit diagram showing a nonvolatile memory according to a third embodiment.
Figure 43:
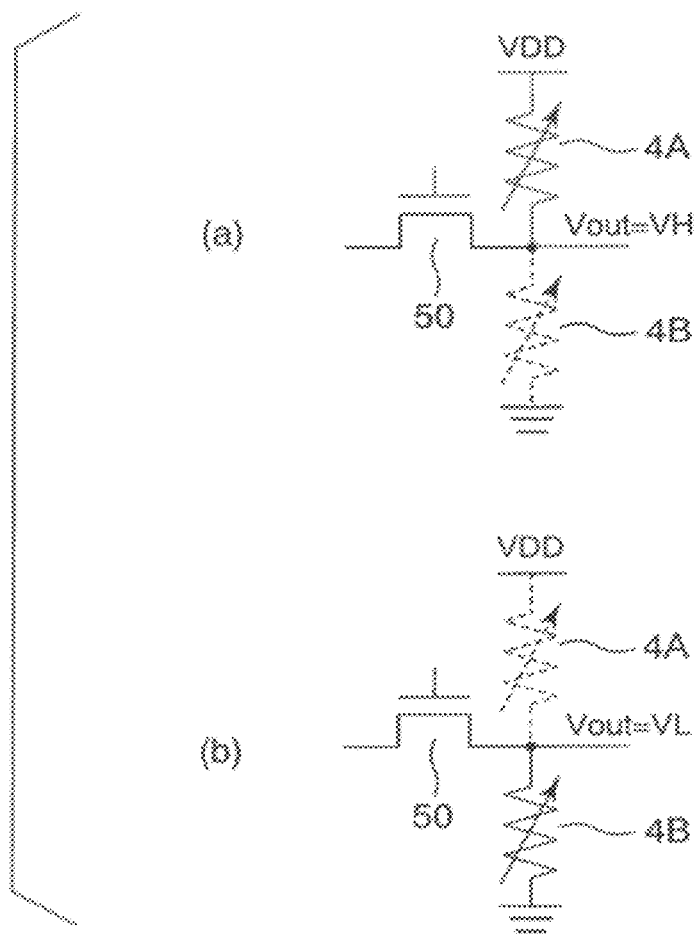
FIGS. 43(a) and 43(b) are diagrams for explaining operations of the nonvolatile memory according to the third embodiment.

Referring now to FIGS. 42 through 43(b), a nonvolatile memory according to a third embodiment of the present invention is described. The nonvolatile memory of this embodiment includes at least one nonvolatile memory cell 1, and the memory cell 1 is the same as the memory cell of the second embodiment shown in FIG. 33, except that ReRAMs are provided in place of the diode 6 (FIG. 42). Specifically, two series-connected ReRAMs 4A and 4B are provided. A source voltage VDD is applied to one end of the ReRAM 4A, and the other end is connected to an output terminal 5. One end of the ReRAM 4B is connected to the output terminal 5, and the other end is grounded. One end of the transistor 50 is connected to a bit line BL, and the other end is connected to the common connection node between the ReRAMs 4 and the diode 6, or to the output terminal 5. The gate of the transistor 50 is connected to a word line WL.

As shown in FIG. 43(a), the upper ReRAM 4A is made to have a low resistance, and the lower ReRAM 4B is made to have a high resistance, so that a high-level signal VH is output from the output terminal 5. Also, as shown in FIG. 43(b), the upper ReRAM 4A is made to have a high resistance, and the lower ReRAM 4B is made to have a low resistance, so that a low-level signal VL is output from the output terminal 5. Here, VH is higher than VL. If the ratio between the low resistance and the high resistance is sufficiently high, VH can be made almost equal to VDD, and VL can be made almost equal to 0 V. Accordingly, the nonvolatile memory of this embodiment can be used as SRAMs for a FPGA. The ratio of the high resistance value to the low resistance value (=high resistance value/low resistance value) is preferably higher, and should be at least $1.0 \times 10^3$.

Figure 44:
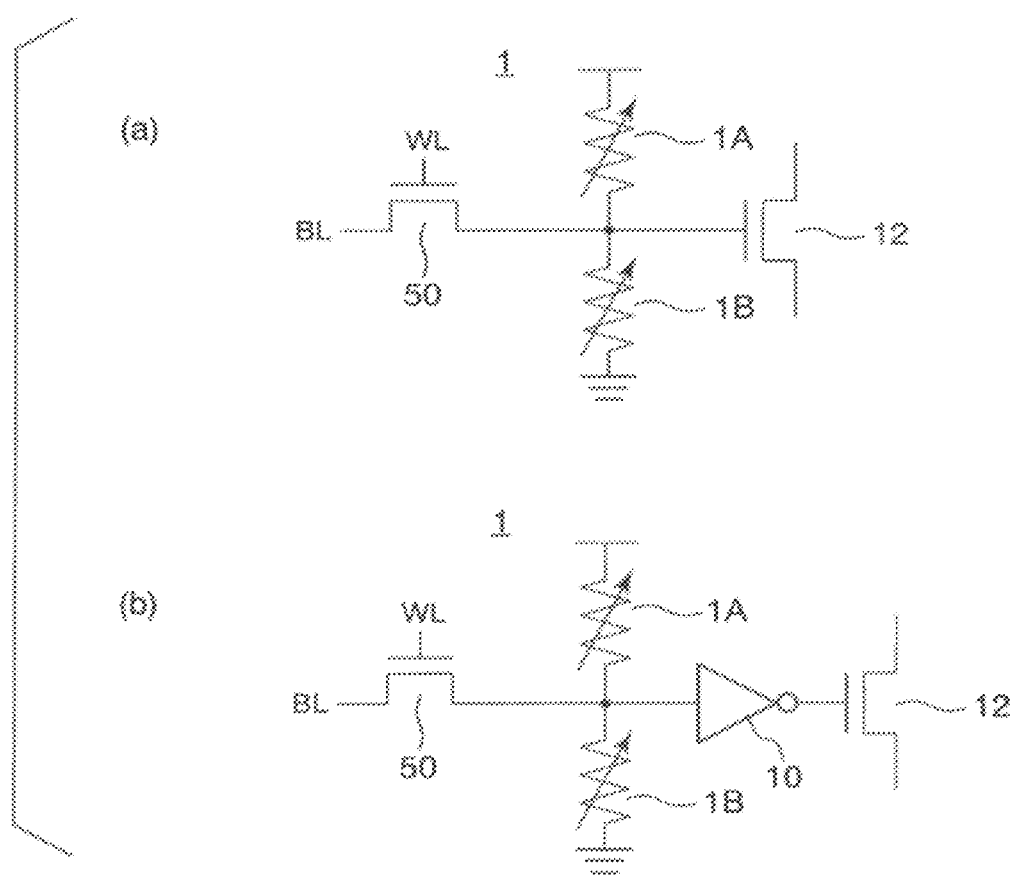
FIGS. 44(a), 44(b), and 44(b) are circuit diagrams showing a specific example of a circuit element using a memory cell according to the third embodiment.

FIG. 44(a) shows a first specific example of a circuit element using a memory cell 1 according to this embodiment. FIG. 44(b) shows a second specific example of such a circuit element. The circuit element of the first specific example shown in FIG. 44(a) is the same as a memory cell 1 according to the second embodiment, except that a pass transistor 12 having its gate connected to the output terminal 5 is provided. The circuit element of this specific example can replace a circuit element in a conventional FPGA, such as a circuit or a three-state buffer circuit having a circuit-information storing SRAM connected to the gate of the pass transistor, for example.

The circuit element of the second specific example shown in FIG. 44(b) is the same as the circuit element of the first specific example, except that an inverter 10 is provided between the memory cell 1 and the pass transistor 12. With the inverter 10, a sufficiently high voltage can be supplied to the gate of the pass transistor 12, even when the output of the memory cell 1 is not sufficiently high due to the program voltage conditions of the ReRAMs 4.

Figure 45:
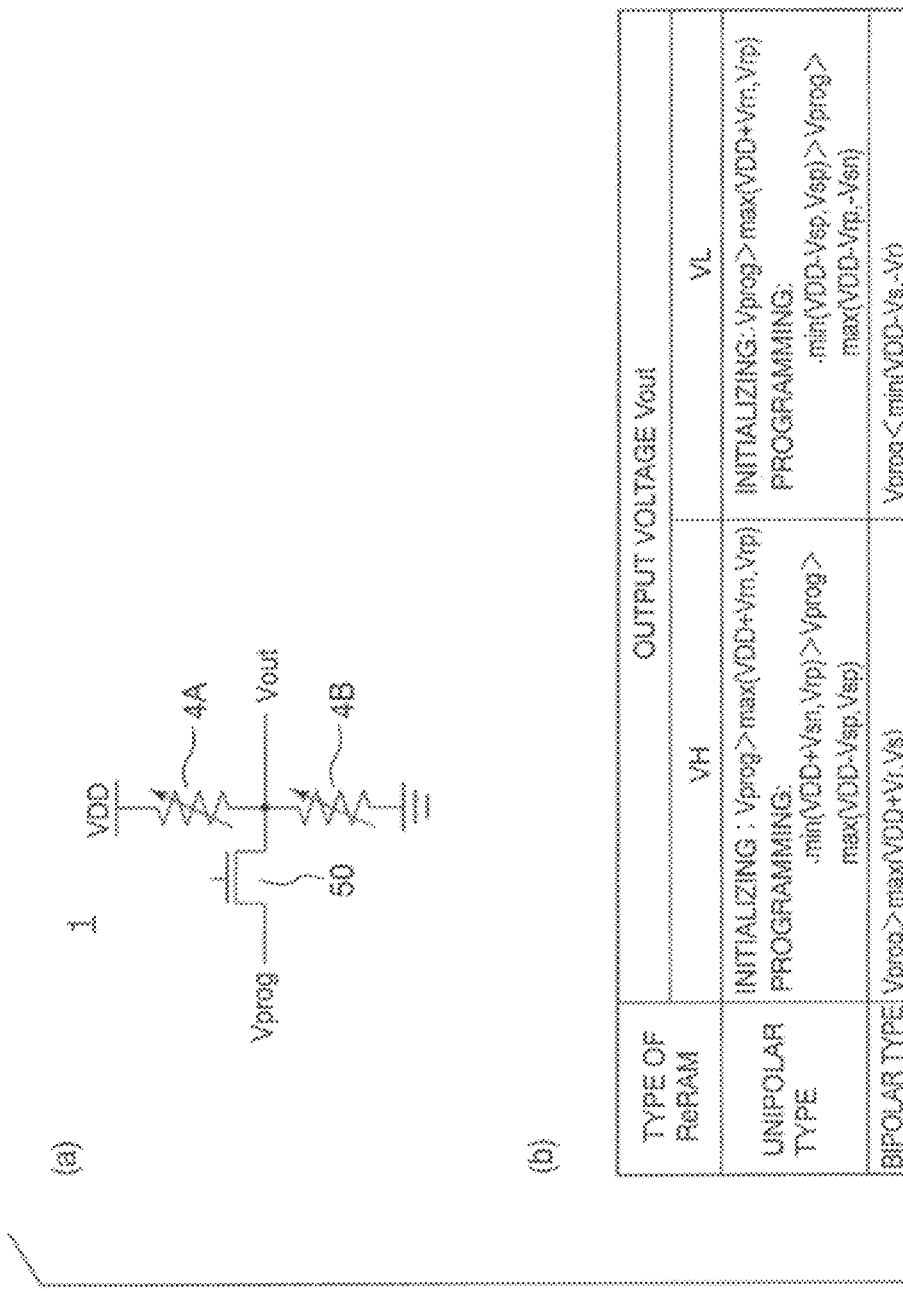
FIGS. 45(a) and 45(b) are diagrams for explaining a method of programming a memory cell according to the third embodiment.

Next, a method of programming a memory cell 1 according to the third embodiment is described. FIG. 45(a) is a diagram showing a case where a program voltage Vprog is supplied to the memory cell 1 shown in FIG. 42. Here, the memory cell 1 shown in FIG. 42 may use ReRAMs of either a bipolar type or a unipolar type.

First, a case where unipolar-type ReRAMs are used as the ReRAMs 4A and 4B is described. In this case, the two steps of initializing and programming need to be carried out. First, to perform initializing, Vprog>max(VDD+Vrn, Vrp) is supplied so that the ReRAMs 4A and 4B are both put into a low-resistance state. Here, max(A, B) represents A or B, whichever is larger.

In the next step, an appropriate voltage is applied, so that one of the ReRAMs, or the ReRAM 4B, for example, is put into a high-resistance state. To set the output voltage Vout at VH, the ReRAM 4B is put into a high-resistance state while the ReRAM 4A is maintained in a low-resistance state. The conditions for putting the ReRAM 4B into a high-resistance state are expressed as follows: Vrp>Vprog>Vsp. The conditions for maintaining the ReRAM 4A in a low-resistance state are expressed as follows: Vsp>VDD−Vprog>−Vsn. With the two sets of conditions being combined, the following relationship is established: min(Vdd+Vsn, Vrp)>Vprog>max(VDD−Vsp, Vsp) (see FIG. 45(b)). Here, min(A, B) represents A or B, whichever is smaller.

To set the output voltage Vout at VL, on the other hand, the ReRAM 4A is put into a high-resistance state, and the ReRAM 4B is maintained in a low-resistance state. The conditions for putting the ReRAM 4A into a high-resistance state are expressed as follows: Vrp>VDD−Vprog>Vsp. The conditions for maintaining the ReRAM 4B in a low-resistance state are expressed as follows: Vsp>Vprog>−Vsn. With the two sets of conditions being combined, the following relationship is established: min(VDD−Vsp, Vsp)>Vprog>max(VDD−Vrp, −Vsn) (see FIG. 45(b)).

Next, the program voltage to be applied in a case where bipolar-type ReRAMs are used as the ReRAMs 4A and 4B is described. In this case, programming can be performed through one-time voltage application. To set the output voltage Vout at VH, the ReRAM 4A is put into a low-resistance state, and the ReRAM 4B is put into a high-resistance state.

The condition for putting the ReRAM 4A into a low-resistance state is expressed as follows: VDD−Vprog<−Vr. The condition for putting the ReRAM 4B into a high-resistance state is expressed as follows: Vprog>Vs. To sum up, the following relationship is established: Vprog>max(VDD+Vr, Vs) (see FIG. 45(b)).

To set the output voltage Vout at VL, the ReRAM 4A is put into a high-resistance state, and the ReRAM 4B is put into a low-resistance state. The condition for putting the ReRAM 4A into a high-resistance state is expressed as follows: VDD−Vprog>V1. The condition for putting the ReRAM 4B into a low-resistance state is expressed as follows: Vprog<−V2. To sum up, the following relationship is established: Vprog<min (VDD−Vs, −Vr) (see FIG. 45(b)).

Example

Figure 46:
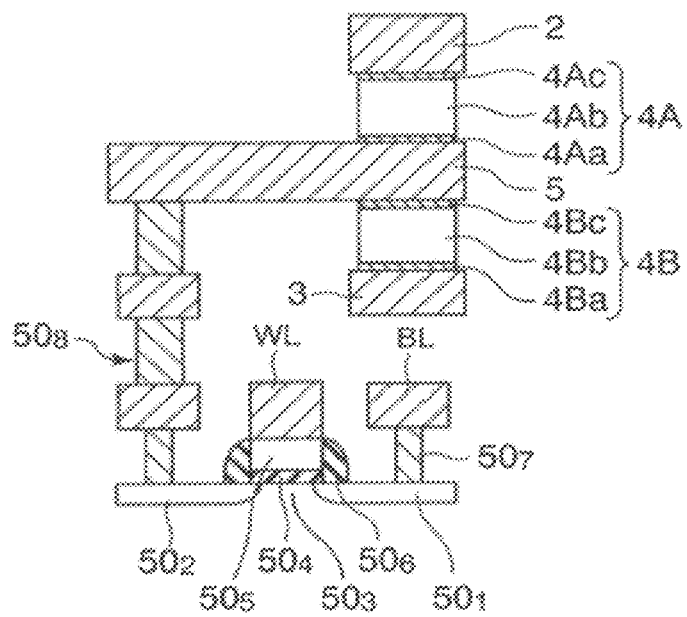
FIG. 46 is a cross-sectional view of a memory cell of an Example of the third embodiment.

FIG. 46 is a cross-sectional view showing a case where an example of a memory cell 1 according to the third embodiment is manufactured. The memory cell 1 of this example has ReRAMs 4A and 4B formed in wire layers, and has a programming transistor 50 formed on a silicon substrate. The programming transistor 50 in the memory cell 1 of this example includes: an N-type source region $50_1$ and drain region $50_2$ formed at a distance from each other in a P-type semiconductor substrate; a gate insulating film $50_4$ that is formed on a semiconductor region $50_3$ to be the channel between the source region $50_1$ and the drain region $50_2$; a gate electrode $50_5$ formed on the gate insulating film $50_4$; and gate sidewalls $50_6$ that are formed on the side portions of the gate electrode $50_5$ and are made of an insulating material. The gate electrode $50_5$ is connected to a word line WL, and the source region $50_1$ is connected to a bit line BL via a plug $50_7$. The drain $50_2$ is connected to a wire 5 to be an output terminal 5 via a plug $50_8$. A wire 3 connected to a ground source is provided below the wire 5, and the ReRAM 4B having a stack structure formed by stacking an electrode 4Ba, a variable resistance 4Bb, and an electrode 4Bc in this order is provided between the wire 3 and the wire 5. The ReRAM 4A having a stack structure formed by stacking an electrode 4Aa, a variable resistance 4Ab, and an electrode 4Ac in this order is formed on the wire 5. A wire 2 to which the source voltage VDD is to be applied is formed on the ReRAM 4A.

In this example, a nonvolatile memory cell can be formed in an area equal to the area of a transistor. Accordingly, the area of a FPGA can be made smaller by using this nonvolatile memory, instead of SRAMs storing circuit information.

Figure 47:
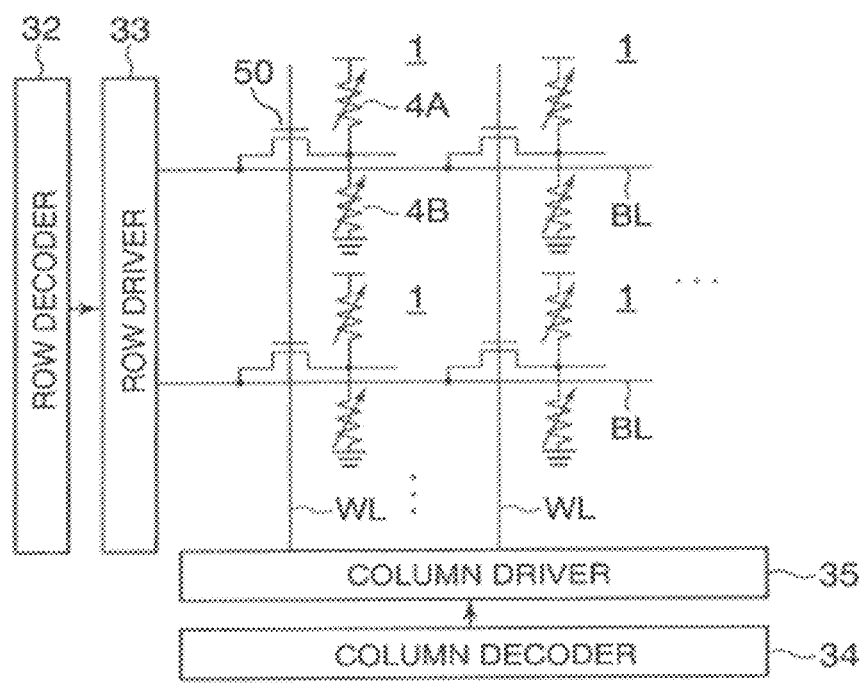
FIG. 47 is a circuit diagram illustrating a case where memory cells according to the third embodiment are used as memories for a FPGA.

FIG. 47 shows a structure formed in a case where a nonvolatile memory of the third embodiment is used as the memory to store the circuit information about a FPGA. As the circuits for programming, a row driver 33, a row decoder 32, a column driver 35, and a column decoder 34 are provided. This structure differs from the circuits for programming according to the first embodiment shown in FIG. 25, in that a power supply circuit independently supplies power to the memory cells. Therefore, the circuits for programming are independent of the memory circuit in the third embodiment. Accordingly, the structure of this embodiment can be used as a dynamic reconfigurable circuit.

Figure 48:
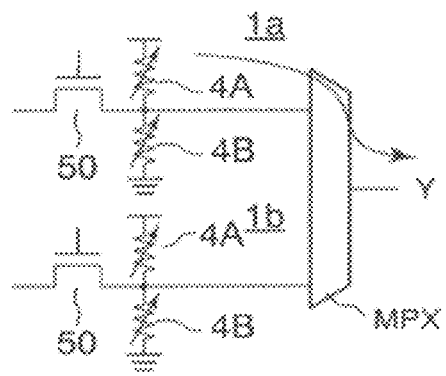
FIG. 48 is a circuit diagram showing a case where memory cells according to the third embodiment are used as a dynamic reconfigurable circuit.

In the third embodiment, a dynamic reconfig operation can be realized with the same circuit structure and control method as those of the second embodiment. FIG. 48 is a circuit diagram of a dynamic reconfigurable circuit. The circuit structure includes two memory cells 1a and 1b each having the same structure as that shown in FIG. 45, and the outputs of those memory cells are input to a multiplexer MPX. The multiplexer MPX selects the output of one of the memory cells, and outputs the selected output to an output terminal Y.

Figure 49:
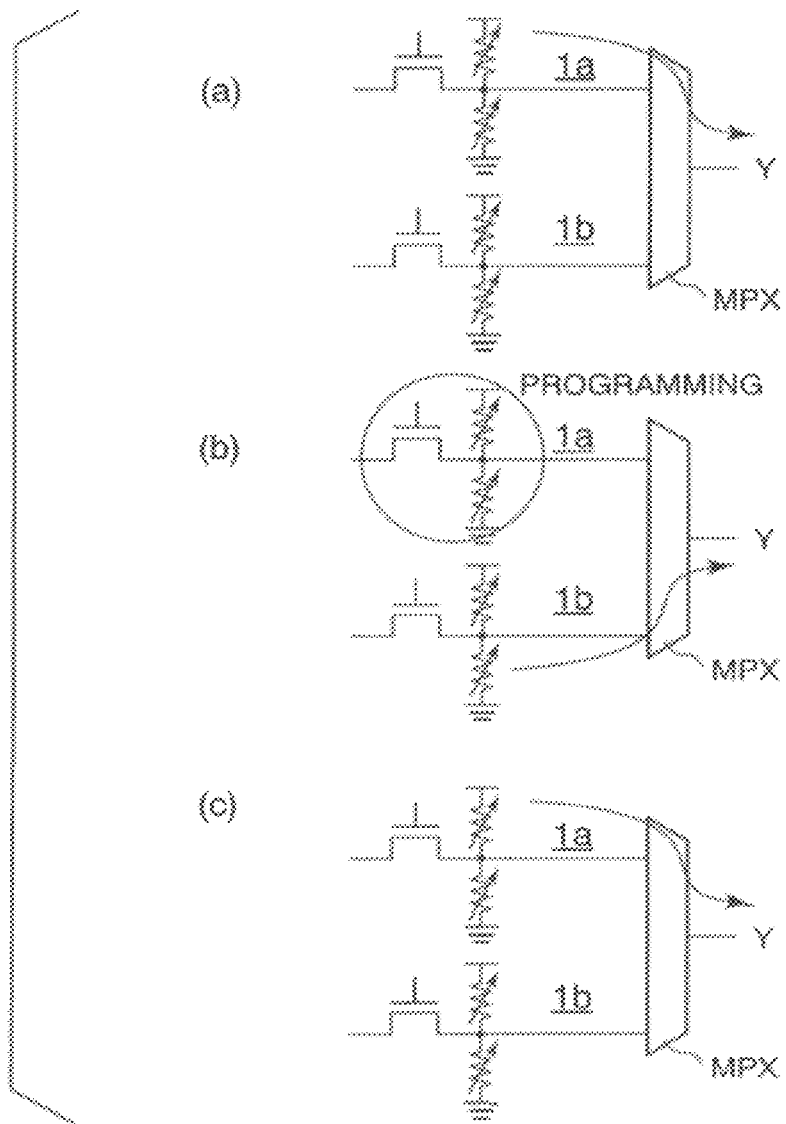
FIGS. 49(a), 49(b), and 49(c) are diagrams for explaining operations of the circuit illustrated in FIG. 48.

FIGS. 49(a), 49(b), and 49(c) are diagrams illustrating a control method used in a case where the dynamic reconfig operation is performed. In the initial state, the same value is written in the two memory cells 1a and 1b, and the output of the upper memory cell is output to the output terminal Y (FIG. 49(a)). When the value output from the output terminal Y is to be changed, the value in the lower memory cell 1b is made to be output from the multiplexer MPX, and the value in the upper memory cell is rewritten or programmed (FIG. 49(b)). In this manner, the influence of the rewriting of the upper memory cell 1a on the memory cell 1b can be eliminated. After the value in the upper memory cell 1a is rewritten, the output of the upper memory cell 1a is output from the multiplexer MPX to the output terminal Y, and the value in the lower memory cell 1b is changed to the same value as the value in the upper memory cell is (FIG. 49(c)).

JP-A 2004-213860(KOKAI) discloses a technique involving a structure similar to the third embodiment. According to JP-A 2004-213860(KOKAI), a PCM (Phase Change Memory), a MTJ (Magnetic Tunnel Junction), and a GMR (Giant Magneto-Resistive effect) device are used as nonvolatile memories. A pass transistor is switched on and off in accordance with the resistance ratios of those memories and device. However, the resistance change of a PCM, a MTJ, and a GMR are normally smaller than $1.0\times10^3$. Therefore, it is not easy to switch a pass transistor on and off. In an embodiment of the present invention, a novel structure is formed by using ReRAMs known to have a resistance change of $1.0\times10^4$ or greater, so that the output voltage can be effectively swung between 0 V and VDD.

Furthermore, a nonvolatile memory cell of an embodiment of the present invention can be formed in an area equal to the area of one transistor, and the area of a FPGA can be effectively made smaller. Also, with the circuit structure illustrated in FIG. 48, a dynamic reconfig operation can be realized.

United States Patent Publication No. 2007/0146012 also discloses a technique involving a structure similar to the third embodiment. United States Patent Publication No. 2007/0146012 discloses a nonvolatile memory cell using the PCM illustrated in FIG. 17 of United States Patent Publication No. 2007/0146012, and a nonvolatile memory cell using the ion conducting memory illustrated in FIG. 23 of United States Patent Publication No. 2007/0146012. The former memory cell using a PCM includes a p-MOSFET 1706 and an n-MOSFET 1708 to control the current when the PCM is programmed. Therefore, this memory cell has a larger area than a memory cell according to an embodiment of the present invention. The latter ion conducting memory is known to have a low memory program voltage. Therefore, when a gate voltage is to be supplied to the gate of a pass transistor in the latter memory cell, it is difficult to output a voltage equal to or higher than the threshold value of the pass transistor. An embodiment of the present invention can achieve a small-size structure and a sufficiently high output voltage by using ReRAMs.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A nonvolatile memory comprising
at least one memory cell including:
a variable resistance memory comprising one end connected to a first terminal, and the other end connected to a second terminal, a drive voltage being applied to the first terminal;
a diode comprising a cathode connected to the second terminal, and an anode connected to a third terminal, a ground potential being applied to the third terminal;
an inverter that has an input terminal connected to the second terminal;
a pass transistor that receives an output of the inverter; and
a programming MOSFET having a source and a drain, one of the source and drain being connected to the second terminal.

2. The memory according to claim 1, further comprising:
a first wire to which the other one of the source and the drain of the programming MOSFET is connected;
a second wire to which a gate of the programming MOSFET is connected;
a first driver that drives the first wire; and
a second driver that drives the second wire.

3. The memory according to claim 1, wherein
the diode includes a P-type semiconductor layer formed on a semiconductor substrate, and an N-type semiconductor layer formed on the P-type semiconductor layer, and
the variable resistance memory includes a first electrode formed on the P-type N-type semiconductor layer, a variable resistance layer formed on the first electrode, and a second electrode formed on the variable resistance layer.

4. The memory according to claim 1, wherein the diode is one of a diode-connected n-MOSFET and a diode-connected p-MOSFET.

5. The memory according to claim 1, wherein the variable resistance memory is formed in a wire layer, and the diode also is formed in the wire layer.

6. The memory according to claim 1, wherein the nonvolatile memory including a plurality of memory cells arranged in a matrix form, and the nonvolatile memory further comprises row address lines to which the first terminals are connected, column address lines to which the third terminals are connected, a row driver driving the row address lines, and a column driver driving the column address lines, the row driver and the column driver selectively applying an program voltage to one of the row address lines and one of column address lines respectively at the time of writing.

7. The memory according to claim 6, wherein the row driver supply the supply voltage to all of the row address lines and the column driver supply the ground potential to all of the column address lines at the time of operating.

8. The memory according to claim 1, wherein the variable resistance memory and the diode are formed in a wire layer, and the programming MOSFET is formed in a Si substrate.

9. The memory according to claim 1, wherein the variable resistance memory is formed in a wire layer, the diode is formed with a p-type well and an n-type doped region formed in the p-type well, and the programming MOSFET is formed in a Si substrate.

10. The memory according to claim 1, wherein the variable resistance memory is formed in a wire layer, the diode is formed with a diode-connected MOSFET, and the programming MOSFET is formed in a Si substrate.

11. The memory according to claim 1, wherein the nonvolatile memory including a plurality of memory cells arranged in a matrix form, and the nonvolatile memory further comprises row address lines to which the first terminals are connected, column address lines to which the third terminals are connected, a row driver driving the row address lines, and a column driver driving the column address lines, and wherein the first terminal are connected in common, the third terminal are connected in common, gates of the programming MOSFET are connected to the column driver, and drains of the programming MOSFET are connected to the row driver.

12. A reconfigurable circuit comprising:
the nonvolatile memory according to claim 1; and
a multiplexer,
the nonvolatile memory including at least two memory cells, and the multiplexer selecting and outputting one of outputs of the at least two memory cells.

13. The circuit according to claim 12, wherein the multiplexer outputs an output of a first memory cell in the at least two memory cells in an initial state, outputs an output of a second memory cell different from the first memory cell in the at least two memory cells and rewrites a value to be stored in the first memory cell in a second state, and outputs the value of the first memory cell in a third state.

14. A reconfigurable circuit comprising
a FPGA that includes a memory storing circuit information,
the memory storing the circuit information of the FPGA is the nonvolatile memory according to claim 1.

* * * * *